US012255575B2

(12) United States Patent
Clemente et al.

(10) Patent No.: US 12,255,575 B2
(45) Date of Patent: Mar. 18, 2025

(54) MOUNTING APPARATUS FOR PHOTOVOLTAIC MODULES

(71) Applicant: GAF Energy LLC, Parsippany, NJ (US)

(72) Inventors: Peter Clemente, San Rafael, CA (US); Brian Atchley, Parsippany, NJ (US); Brian West, Parsippany, NJ (US); Evan Wray, Parsippany, NJ (US); Daniel East, Parsippany, NJ (US); Mike Kuiper, Parsippany, NJ (US); Thierry Nguyen, Parsippany, NJ (US); Richard Perkins, Parsippany, NJ (US)

(73) Assignee: GAF Energy LLC, Parsippany, NJ (US)

( * ) Notice: Subject to any disclaimer, the term of this patent is extended or adjusted under 35 U.S.C. 154(b) by 0 days.

(21) Appl. No.: 18/315,975

(22) Filed: May 11, 2023

(65) Prior Publication Data

US 2023/0283225 A1    Sep. 7, 2023

Related U.S. Application Data

(63) Continuation of application No. 17/941,934, filed on Sep. 9, 2022, now Pat. No. 11,689,149, which is a
(Continued)

(51) Int. Cl.
*H02S 20/25* (2014.01)
*E04D 1/00* (2006.01)
(Continued)

(52) U.S. Cl.
CPC ............... *H02S 20/25* (2014.12); *E04D 1/12* (2013.01); *E04D 1/265* (2013.01); *E04D 1/2918* (2019.08);
(Continued)

(58) Field of Classification Search
CPC ......... E04D 1/12; E04D 1/265; E04D 1/2918; E04D 1/2956; E04D 1/30; E04D 1/34;
(Continued)

(56) References Cited

U.S. PATENT DOCUMENTS

| 1,981,467 A | 11/1934 | Radtke |
| 3,156,497 A | 11/1964 | Lessard |

(Continued)

FOREIGN PATENT DOCUMENTS

| CA | 2829440 A | 5/2019 |
| CH | 700095 A2 | 6/2010 |

(Continued)

OTHER PUBLICATIONS

Sunflare, Procducts: "Sunflare Develops Prototype For New Residential Solar Shingles"; 2019 <<sunflaresolar.com/news/sunflare-develops-prototype-for-new-residential-solar-shingles>> retrieved Feb. 2, 2021.

(Continued)

*Primary Examiner* — James M Ference
(74) *Attorney, Agent, or Firm* — GREENBERG TRAURIG, LLP

(57) ABSTRACT

A system includes a plurality of photovoltaic modules, each having a mat with an edge and a spacer with an edge, the edge of the mat being attached to the edge of the spacer. The spacer includes a plurality of support members and a solar module mounted to the support members. Each of the support members includes a ledge. The solar module and the ledge form a space therebetween. The space is sized and shaped to receive an edge of a solar module of another of the photovoltaic modules. The spacer of one of the photovoltaic modules overlays the mat of another of the photovoltaic modules.

19 Claims, 20 Drawing Sheets

Related U.S. Application Data continuation of application No. 17/501,606, filed on Oct. 14, 2021, now Pat. No. 11,444,569.

(60) Provisional application No. 63/091,428, filed on Oct. 14, 2020.

(51) Int. Cl.
| | |
|---|---|
| *E04D 1/12* | (2006.01) |
| *E04D 1/26* | (2006.01) |
| *E04D 1/30* | (2006.01) |
| *E04D 1/34* | (2006.01) |
| *H02S 30/10* | (2014.01) |

(52) U.S. Cl.
CPC ............ *E04D 1/2956* (2019.08); *E04D 1/30* (2013.01); *E04D 1/34* (2013.01); *H02S 30/10* (2014.12); *E04D 2001/308* (2013.01); *E04D 2001/3408* (2013.01); *E04D 2001/345* (2013.01); *E04D 2001/3458* (2013.01); *E04D 2001/3494* (2013.01)

(58) Field of Classification Search
CPC ...... E04D 2001/308; E04D 2001/3408; E04D 2001/345; E04D 2001/3458; E04D 2001/3494; H01L 31/02013; H01S 30/10; Y02B 10/10; Y02E 10/50; Y02E 10/52
See application file for complete search history.

(56) References Cited

U.S. PATENT DOCUMENTS

| | | | |
|---|---|---|---|
| 3,407,556 A * | 10/1968 | Leibrook | E04D 1/26 |
| | | | 52/559 |
| 3,581,779 A | 6/1971 | Sylvia, Jr. | |
| 4,258,948 A | 3/1981 | Hoffmann | |
| 4,336,413 A | 6/1982 | Tourneux | |
| 4,349,220 A | 9/1982 | Carroll et al. | |
| 4,499,702 A | 2/1985 | Turner | |
| 4,636,577 A | 1/1987 | Peterpaul | |
| 5,056,288 A | 10/1991 | Funaki | |
| 5,167,579 A | 12/1992 | Rotter | |
| 5,338,369 A | 8/1994 | Rawlings | |
| 5,409,549 A | 4/1995 | Mori | |
| 5,437,735 A * | 8/1995 | Younan | H01L 31/076 |
| | | | 52/173.3 |
| 5,590,495 A | 1/1997 | Bressler et al. | |
| 5,642,596 A | 7/1997 | Waddington | |
| 5,651,837 A | 7/1997 | Ohtsuka et al. | |
| 5,746,839 A | 5/1998 | Dinwoodie | |
| 5,951,785 A | 9/1999 | Uchihashi et al. | |
| 6,008,450 A | 12/1999 | Ohtsuka et al. | |
| 6,033,270 A | 3/2000 | Stuart | |
| 6,046,399 A | 4/2000 | Kapner | |
| 6,065,256 A | 5/2000 | Joko et al. | |
| 6,242,685 B1 | 6/2001 | Mizukami et al. | |
| 6,308,482 B1 | 10/2001 | Strait | |
| 6,320,114 B1 | 11/2001 | Kuechler | |
| 6,320,115 B1 * | 11/2001 | Kataoka | B32B 17/10788 |
| | | | 156/286 |
| 6,336,304 B1 | 1/2002 | Mimura et al. | |
| 6,341,454 B1 | 1/2002 | Koleoglou | |
| 6,370,828 B1 | 4/2002 | Genschorek | |
| 6,407,329 B1 | 6/2002 | Iino et al. | |
| 6,453,629 B1 | 9/2002 | Nakazima et al. | |
| 6,465,724 B1 | 10/2002 | Garvison et al. | |
| 6,521,821 B2 | 2/2003 | Makita et al. | |
| 6,576,830 B2 | 6/2003 | Nagao et al. | |
| 6,928,781 B2 | 8/2005 | Desbois et al. | |
| 6,972,367 B2 | 12/2005 | Federspiel et al. | |
| 7,138,578 B2 | 11/2006 | Komamine | |
| 7,155,870 B2 | 1/2007 | Almy | |
| 7,178,295 B2 | 2/2007 | Dinwoodie | |
| 7,487,771 B1 | 2/2009 | Eiffert et al. | |
| 7,587,864 B2 | 9/2009 | McCaskill et al. | |
| 7,678,990 B2 | 3/2010 | McCaskill et al. | |
| 7,678,991 B2 | 3/2010 | McCaskill et al. | |
| 7,748,191 B2 | 7/2010 | Podirsky | |
| 7,819,114 B2 | 10/2010 | Augenbraun et al. | |
| 7,824,191 B1 | 11/2010 | Podirsky | |
| 7,832,176 B2 | 11/2010 | McCaskill et al. | |
| 8,118,109 B1 | 2/2012 | Hacker | |
| 8,168,880 B2 | 5/2012 | Jacobs et al. | |
| 8,173,889 B2 | 5/2012 | Kalkanoglu et al. | |
| 8,210,570 B1 | 7/2012 | Railkar et al. | |
| 8,215,071 B2 | 7/2012 | Lenox | |
| 8,276,329 B2 | 10/2012 | Lenox | |
| 8,309,840 B2 | 11/2012 | Stevens et al. | |
| 8,312,693 B2 | 11/2012 | Cappelli | |
| 8,319,093 B2 | 11/2012 | Kalkanoglu et al. | |
| 8,333,040 B2 | 12/2012 | Shiao et al. | |
| 8,371,076 B2 | 2/2013 | Jones et al. | |
| 8,375,653 B2 * | 2/2013 | Shiao | H02S 20/23 |
| | | | 52/173.3 |
| 8,404,967 B2 | 3/2013 | Kalkanoglu et al. | |
| 8,410,349 B2 * | 4/2013 | Kalkanoglu | H01L 31/02008 |
| | | | 52/173.3 |
| 8,418,415 B2 | 4/2013 | Shiao et al. | |
| 8,438,796 B2 | 5/2013 | Shiao et al. | |
| 8,468,754 B2 | 6/2013 | Railkar et al. | |
| 8,468,757 B2 | 6/2013 | Krause et al. | |
| 8,505,249 B2 | 8/2013 | Geary | |
| 8,512,866 B2 | 8/2013 | Taylor | |
| 8,513,517 B2 * | 8/2013 | Kalkanoglu | H02S 20/25 |
| | | | 136/251 |
| 8,522,493 B1 | 9/2013 | Rogers | |
| 8,586,856 B2 | 11/2013 | Kalkanoglu et al. | |
| 8,601,754 B2 | 12/2013 | Jenkins et al. | |
| 8,629,578 B2 | 1/2014 | Kurs et al. | |
| 8,646,228 B2 | 2/2014 | Jenkins | |
| 8,656,657 B2 | 2/2014 | Livsey et al. | |
| 8,671,630 B2 | 3/2014 | Lena et al. | |
| 8,677,702 B2 | 3/2014 | Jenkins | |
| 8,695,289 B2 | 4/2014 | Koch et al. | |
| 8,713,858 B1 | 5/2014 | Xie | |
| 8,713,860 B2 | 5/2014 | Railkar et al. | |
| 8,733,038 B2 | 5/2014 | Kalkanoglu et al. | |
| 8,789,321 B2 | 7/2014 | Ishida | |
| 8,793,940 B2 | 8/2014 | Kalkanoglu et al. | |
| 8,793,941 B2 | 8/2014 | Bosler et al. | |
| 8,826,607 B2 * | 9/2014 | Shiao | H01L 31/048 |
| | | | 52/173.3 |
| 8,835,751 B2 * | 9/2014 | Kalkanoglu | H01L 31/02 |
| | | | 136/251 |
| 8,863,451 B2 | 10/2014 | Jenkins et al. | |
| 8,898,970 B2 | 12/2014 | Jenkins et al. | |
| 8,925,262 B2 | 1/2015 | Railkar et al. | |
| 8,943,766 B2 | 2/2015 | Gombarick et al. | |
| 8,946,544 B2 | 2/2015 | Jabos et al. | |
| 8,950,128 B2 | 2/2015 | Kalkanoglu et al. | |
| 8,959,848 B2 * | 2/2015 | Jenkins | E04D 1/30 |
| | | | 52/173.3 |
| 8,966,838 B2 | 3/2015 | Jenkins | |
| 8,966,850 B2 | 3/2015 | Jenkins et al. | |
| 8,994,224 B2 | 3/2015 | Mehta et al. | |
| 9,032,672 B2 | 5/2015 | Livsey et al. | |
| 9,166,087 B2 | 10/2015 | Chihlas et al. | |
| 9,169,646 B2 | 10/2015 | Rodrigues et al. | |
| 9,170,034 B2 * | 10/2015 | Bosler | H02S 20/00 |
| 9,178,465 B2 | 11/2015 | Shiao et al. | |
| 9,202,955 B2 * | 12/2015 | Livsey | H01L 31/048 |
| 9,212,832 B2 | 12/2015 | Jenkins | |
| 9,217,584 B2 | 12/2015 | Kalkanoglu | H01L 31/048 |
| 9,270,221 B2 | 2/2016 | Zhao | |
| 9,273,885 B2 | 3/2016 | Rordigues et al. | |
| 9,276,141 B2 | 3/2016 | Kalkanoglu et al. | |
| 9,331,224 B2 * | 5/2016 | Koch | H02S 40/36 |
| 9,356,174 B2 | 5/2016 | Duarte et al. | |
| 9,359,014 B1 | 6/2016 | Yang et al. | |
| 9,412,890 B1 | 8/2016 | Meyers | |
| 9,528,270 B2 * | 12/2016 | Jenkins | E04B 7/18 |
| 9,605,432 B1 | 3/2017 | Robbins | |
| 9,711,672 B2 | 7/2017 | Wang | |

(56) References Cited

U.S. PATENT DOCUMENTS

| | | | |
|---|---|---|---|
| 9,755,573 B2 | 9/2017 | Livsey et al. | |
| 9,786,802 B2* | 10/2017 | Shiao | H01L 31/048 |
| 9,831,818 B2 | 11/2017 | West | |
| 9,912,284 B2 | 3/2018 | Svec | |
| 9,923,515 B2 | 3/2018 | Rodrigues et al. | |
| 9,938,729 B2 | 4/2018 | Coon | |
| 9,991,412 B2 | 6/2018 | Gonzalez et al. | |
| 9,998,067 B2 | 6/2018 | Kalkanoglu et al. | |
| 10,027,273 B2 | 7/2018 | West et al. | |
| 10,115,850 B2 | 10/2018 | Rodrigues et al. | |
| 10,128,660 B1 | 11/2018 | Apte et al. | |
| 10,156,075 B1* | 12/2018 | McDonough | B29C 69/001 |
| 10,187,005 B2 | 1/2019 | Rodrigues et al. | |
| 10,256,765 B2 | 4/2019 | Rodrigues et al. | |
| 10,284,136 B1* | 5/2019 | Mayfield | F24S 25/636 |
| 10,454,408 B2 | 10/2019 | Livsey et al. | |
| 10,530,292 B1 | 1/2020 | Cropper et al. | |
| 10,560,048 B2 | 2/2020 | Fisher et al. | |
| 10,563,406 B2 | 2/2020 | Kalkanoglu et al. | |
| D879,031 S | 3/2020 | Lance et al. | |
| 10,579,028 B1 | 3/2020 | Jacob | |
| 10,734,938 B2 | 8/2020 | Yang et al. | |
| 10,784,813 B2 | 9/2020 | Kalkanoglu et al. | |
| D904,289 S | 12/2020 | Lance et al. | |
| 10,862,420 B2 | 12/2020 | Nguyen et al. | |
| 10,985,688 B2 | 4/2021 | Seery et al. | |
| 11,012,026 B2 | 5/2021 | Kalkanoglu et al. | |
| 11,177,639 B1 | 11/2021 | Nguyen et al. | |
| 11,217,715 B2 | 1/2022 | Sharenko et al. | |
| 11,251,744 B1 | 2/2022 | Bunea et al. | |
| 11,258,399 B2 | 2/2022 | Kalkanoglu et al. | |
| 11,283,394 B2 | 3/2022 | Perkins et al. | |
| 11,424,379 B2* | 8/2022 | Sharenko | B32B 27/286 |
| 11,431,280 B2* | 8/2022 | Liu | H01L 31/049 |
| 11,431,281 B2* | 8/2022 | Perkins | B32B 27/32 |
| 11,444,569 B2 | 9/2022 | Clemente | |
| 11,689,149 B2* | 6/2023 | Clemente | H01L 31/02013 52/173.3 |
| 2002/0053360 A1 | 5/2002 | Kinoshita et al. | |
| 2002/0129849 A1 | 9/2002 | Heckeroth | |
| 2003/0010374 A1 | 1/2003 | Dinwoodie | |
| 2003/0101662 A1 | 6/2003 | Ullman | |
| 2003/0132265 A1 | 7/2003 | Villela et al. | |
| 2003/0154667 A1 | 8/2003 | Dinwoodie | |
| 2003/0217768 A1 | 11/2003 | Guha | |
| 2004/0000334 A1 | 1/2004 | Ressler | |
| 2004/0187909 A1 | 9/2004 | Sato et al. | |
| 2005/0030187 A1 | 2/2005 | Peress et al. | |
| 2005/0115603 A1 | 6/2005 | Yoshida et al. | |
| 2005/0144870 A1 | 7/2005 | Dinwoodie | |
| 2005/0178428 A1 | 8/2005 | Laaly et al. | |
| 2005/0193673 A1 | 9/2005 | Rodrigues et al. | |
| 2006/0042683 A1 | 3/2006 | Gangemi | |
| 2006/0046084 A1* | 3/2006 | Yang | E04D 5/10 525/240 |
| 2006/0266405 A1 | 11/2006 | Lenox | |
| 2007/0074757 A1 | 4/2007 | Mellott et al. | |
| 2007/0181174 A1 | 8/2007 | Ressler | |
| 2007/0193618 A1 | 8/2007 | Bressler et al. | |
| 2007/0249194 A1 | 10/2007 | Liao | |
| 2007/0295385 A1 | 12/2007 | Sheats et al. | |
| 2008/0000174 A1 | 1/2008 | Flaherty et al. | |
| 2008/0000512 A1 | 1/2008 | Flaherty et al. | |
| 2008/0006323 A1 | 1/2008 | Kalkanoglu et al. | |
| 2008/0035140 A1 | 2/2008 | Placer et al. | |
| 2008/0078440 A1* | 4/2008 | Lim | H01R 4/28 136/251 |
| 2008/0185748 A1 | 8/2008 | Kalkanoglu | |
| 2008/0271773 A1 | 11/2008 | Jacobs et al. | |
| 2008/0271774 A1 | 11/2008 | Kalkanoglu et al. | |
| 2008/0289272 A1 | 11/2008 | Flaherty et al. | |
| 2008/0302030 A1 | 12/2008 | Stancel et al. | |
| 2008/0315061 A1 | 12/2008 | Fath | |
| 2009/0000222 A1 | 1/2009 | Kalkanoglu et al. | |
| 2009/0014057 A1 | 1/2009 | Croft et al. | |
| 2009/0014058 A1* | 1/2009 | Croft | H02S 20/23 136/244 |
| 2009/0019795 A1 | 1/2009 | Szacsvay et al. | |
| 2009/0044850 A1 | 2/2009 | Kimberley | |
| 2009/0095339 A1 | 4/2009 | Nightingale et al. | |
| 2009/0114261 A1 | 5/2009 | Stancel et al. | |
| 2009/0120484 A1 | 5/2009 | Nightingale et al. | |
| 2009/0133340 A1 | 5/2009 | Shiao et al. | |
| 2009/0159118 A1 | 6/2009 | Kalkanoglu et al. | |
| 2009/0178350 A1 | 7/2009 | Kalkanoglu et al. | |
| 2009/0229652 A1 | 9/2009 | Mapel et al. | |
| 2009/0275247 A1 | 11/2009 | Richter et al. | |
| 2010/0019580 A1 | 1/2010 | Croft et al. | |
| 2010/0065107 A1 | 3/2010 | Nightingale et al. | |
| 2010/0095618 A1 | 4/2010 | Edison et al. | |
| 2010/0101634 A1 | 4/2010 | Frank et al. | |
| 2010/0116325 A1* | 5/2010 | Nikoonahad | H01L 31/0504 136/251 |
| 2010/0131108 A1* | 5/2010 | Meyer | H01L 31/048 257/E31.127 |
| 2010/0139184 A1 | 6/2010 | Williams et al. | |
| 2010/0146878 A1 | 6/2010 | Koch et al. | |
| 2010/0159221 A1 | 6/2010 | Kourtakis et al. | |
| 2010/0170169 A1* | 7/2010 | Railkar | E04D 1/26 52/173.3 |
| 2010/0186798 A1 | 7/2010 | Tormen et al. | |
| 2010/0242381 A1* | 9/2010 | Jenkins | H02S 20/25 52/173.3 |
| 2010/0313499 A1 | 12/2010 | Gangemi | |
| 2010/0313501 A1 | 12/2010 | Gangemi | |
| 2010/0325976 A1 | 12/2010 | DeGenfelder et al. | |
| 2010/0326488 A1 | 12/2010 | Aue et al. | |
| 2010/0326501 A1 | 12/2010 | Zhao et al. | |
| 2011/0017278 A1 | 1/2011 | Kalkanoglu et al. | |
| 2011/0030761 A1 | 2/2011 | Kalkanoglu et al. | |
| 2011/0036386 A1 | 2/2011 | Browder | |
| 2011/0036389 A1 | 2/2011 | Hardikar et al. | |
| 2011/0048507 A1 | 3/2011 | Livsey et al. | |
| 2011/0058337 A1 | 3/2011 | Han et al. | |
| 2011/0061326 A1 | 3/2011 | Jenkins | |
| 2011/0100436 A1 | 5/2011 | Cleereman et al. | |
| 2011/0104488 A1 | 5/2011 | Muessig et al. | |
| 2011/0132427 A1 | 6/2011 | Kalkanoglu et al. | |
| 2011/0154750 A1 | 6/2011 | Welter et al. | |
| 2011/0168238 A1 | 7/2011 | Metin et al. | |
| 2011/0185652 A1* | 8/2011 | Lenox | H02S 20/25 52/173.3 |
| 2011/0239555 A1 | 10/2011 | Cook et al. | |
| 2011/0302859 A1 | 12/2011 | Crasnianski | |
| 2011/0314753 A1 | 12/2011 | Farmer et al. | |
| 2012/0034799 A1* | 2/2012 | Hunt | H01L 31/0488 439/212 |
| 2012/0060434 A1 | 3/2012 | Jacobs | |
| 2012/0060902 A1 | 3/2012 | Drake | |
| 2012/0066984 A1 | 3/2012 | Thompson et al. | |
| 2012/0085392 A1 | 4/2012 | Albert et al. | |
| 2012/0137600 A1 | 6/2012 | Jenkins | |
| 2012/0176077 A1 | 7/2012 | Oh et al. | |
| 2012/0186630 A1 | 7/2012 | Jenkins et al. | |
| 2012/0212065 A1 | 8/2012 | Cheng et al. | |
| 2012/0233940 A1 | 9/2012 | Perkins et al. | |
| 2012/0240490 A1 | 9/2012 | Gangemi | |
| 2012/0260977 A1 | 10/2012 | Stancel | |
| 2012/0266942 A1 | 10/2012 | Komatsu et al. | |
| 2012/0279150 A1 | 11/2012 | Pislkak et al. | |
| 2012/0282437 A1 | 11/2012 | Clark et al. | |
| 2012/0291848 A1* | 11/2012 | Sherman | H01L 31/052 136/246 |
| 2013/0008499 A1 | 1/2013 | Verger et al. | |
| 2013/0014455 A1 | 1/2013 | Grieco | |
| 2013/0118558 A1 | 5/2013 | Sherman | |
| 2013/0125482 A1 | 5/2013 | Kalkanoglu et al. | |
| 2013/0180575 A1 | 7/2013 | Jackrel et al. | |
| 2013/0193769 A1 | 8/2013 | Mehta et al. | |
| 2013/0247988 A1 | 9/2013 | Reese et al. | |
| 2013/0284267 A1 | 10/2013 | Plug et al. | |
| 2013/0306137 A1 | 11/2013 | Ko | |
| 2014/0000708 A1 | 1/2014 | Kennihan et al. | |

(56) References Cited

U.S. PATENT DOCUMENTS

| | | |
|---|---|---|
| 2014/0000709 A1 | 1/2014 | Langmaid et al. |
| 2014/0090697 A1 | 4/2014 | Rodrigues et al. |
| 2014/0102518 A1 | 4/2014 | Chihlas et al. |
| 2014/0150843 A1 | 6/2014 | Pearce et al. |
| 2014/0173997 A1* | 6/2014 | Jenkins .................. H02S 20/00 52/173.3 |
| 2014/0179220 A1 | 6/2014 | Railkar et al. |
| 2014/0182222 A1* | 7/2014 | Kalkanoglu ............ H02S 40/36 52/173.3 |
| 2014/0208675 A1 | 7/2014 | Beerer et al. |
| 2014/0254776 A1 | 9/2014 | O'Connor et al. |
| 2014/0266289 A1* | 9/2014 | Della Sera ............... H02J 3/38 324/761.01 |
| 2014/0299179 A1 | 10/2014 | West et al. |
| 2014/0305050 A1 | 10/2014 | Schulze et al. |
| 2014/0311556 A1 | 10/2014 | Feng et al. |
| 2014/0338272 A1 | 11/2014 | Shiao et al. |
| 2014/0352760 A1 | 12/2014 | Haynes et al. |
| 2014/0366464 A1 | 12/2014 | Rodrigues et al. |
| 2015/0089895 A1 | 4/2015 | Leitch |
| 2015/0162459 A1 | 6/2015 | Lu et al. |
| 2015/0340516 A1 | 11/2015 | Kim et al. |
| 2015/0349173 A1 | 12/2015 | Morad et al. |
| 2016/0105144 A1 | 4/2016 | Haynes et al. |
| 2016/0142008 A1* | 5/2016 | Lopez .................... H02S 40/36 136/251 |
| 2016/0254776 A1* | 9/2016 | Rodrigues .............. F24S 25/61 52/173.3 |
| 2016/0276508 A1 | 9/2016 | Huang et al. |
| 2016/0359451 A1 | 12/2016 | Mao et al. |
| 2017/0126171 A1 | 5/2017 | Fisher et al. |
| 2017/0159292 A1 | 6/2017 | Chihlas et al. |
| 2017/0163206 A1 | 6/2017 | Rodrigues et al. |
| 2017/0179319 A1* | 6/2017 | Yamashita ............ H01L 31/048 |
| 2017/0179726 A1 | 6/2017 | Garrity et al. |
| 2017/0194895 A1* | 7/2017 | Fernandes ............... H02S 20/25 |
| 2017/0237390 A1* | 8/2017 | Hudson .................. E04D 3/361 136/251 |
| 2017/0331415 A1 | 11/2017 | Koppi et al. |
| 2017/0353144 A1* | 12/2017 | Guo ....................... H02S 30/10 |
| 2018/0094438 A1 | 4/2018 | Wu et al. |
| 2018/0097472 A1 | 4/2018 | Anderson et al. |
| 2018/0115275 A1 | 4/2018 | Flanigan et al. |
| 2018/0254738 A1 | 9/2018 | Yang et al. |
| 2018/0294765 A1 | 10/2018 | Friedrich et al. |
| 2018/0351502 A1 | 12/2018 | Almy et al. |
| 2018/0367089 A1* | 12/2018 | Stutterheim ............ H02S 20/24 |
| 2019/0030867 A1 | 1/2019 | Sun et al. |
| 2019/0081436 A1 | 3/2019 | Onodi et al. |
| 2019/0089293 A1 | 3/2019 | Almy |
| 2019/0123679 A1* | 4/2019 | Rodrigues .............. H02S 40/36 |
| 2019/0253022 A1 | 8/2019 | Hardar et al. |
| 2019/0273462 A1 | 9/2019 | Almy et al. |
| 2019/0273463 A1 | 9/2019 | Seery et al. |
| 2019/0305717 A1 | 10/2019 | Allen et al. |
| 2020/0109320 A1 | 4/2020 | Jiang |
| 2020/0144958 A1 | 5/2020 | Rodrigues et al. |
| 2020/0220819 A1 | 7/2020 | Vu et al. |
| 2020/0224419 A1 | 7/2020 | Boss et al. |
| 2020/0343397 A1 | 10/2020 | Hem-Jensen |
| 2021/0083619 A1 | 3/2021 | Hegedus |
| 2021/0115223 A1 | 4/2021 | Bonekamp et al. |
| 2021/0159353 A1 | 5/2021 | Li et al. |
| 2021/0159844 A1 | 5/2021 | Sirski |
| 2021/0301536 A1 | 9/2021 | Baggs et al. |
| 2021/0343886 A1 | 11/2021 | Sharenko et al. |
| 2022/0149213 A1 | 5/2022 | Mensink et al. |
| 2023/0283225 A1* | 9/2023 | Clemente .......... H01L 31/02013 52/173.3 |

FOREIGN PATENT DOCUMENTS

| | | |
|---|---|---|
| CN | 202797032 U | 3/2013 |
| CN | 217150978 U | 8/2022 |
| DE | 1958248 A1 | 11/1971 |
| EP | 1039361 A1 | 9/2000 |
| EP | 1837162 A1 | 9/2007 |
| EP | 2196597 A1 | 6/2010 |
| EP | 1774372 A1 | 7/2011 |
| EP | 2446481 A2 | 5/2012 |
| EP | 2784241 A1 | 10/2014 |
| EP | 3772175 A1 | 2/2021 |
| JP | 10046767 A | 2/1998 |
| JP | 2002-106151 A | 4/2002 |
| JP | 2001-098703 A | 10/2002 |
| JP | 2017-027735 A | 2/2017 |
| JP | 2018053707 A | 4/2018 |
| KR | 20090084060 A | 8/2009 |
| KR | 10-1348283 B1 | 1/2014 |
| KR | 10-2019-0000367 A | 1/2019 |
| KR | 10-2253483 B1 | 5/2021 |
| NL | 2026856 B1 | 6/2022 |
| WO | 2010/151777 A2 | 12/2010 |
| WO | 2011/049944 A1 | 4/2011 |
| WO | 2015/133632 A1 | 9/2015 |
| WO | 2018/000589 A1 | 1/2018 |
| WO | 2019/201416 A1 | 10/2019 |
| WO | 2020-159358 A1 | 8/2020 |
| WO | 2021-247098 A1 | 12/2021 |

OTHER PUBLICATIONS

RGS Energy, 3.5kW Powerhouse 3.0 system installed in an afternoon; Jun. 7, 2019 <<facebook.com/RGSEnergy/>> retrieved Feb. 2, 2021.

Tesla, Solar Roof <<tesla.com/solarroof>> retrieved Feb. 2, 2021.

"Types of Roofing Underlayment", Owens Corning Roofing; <<https://www.owenscorning.com/en-us/roofing/tools/how-roofing-underlayment-helps-protect-your-home>> retrieved Nov. 1, 2021.

* cited by examiner

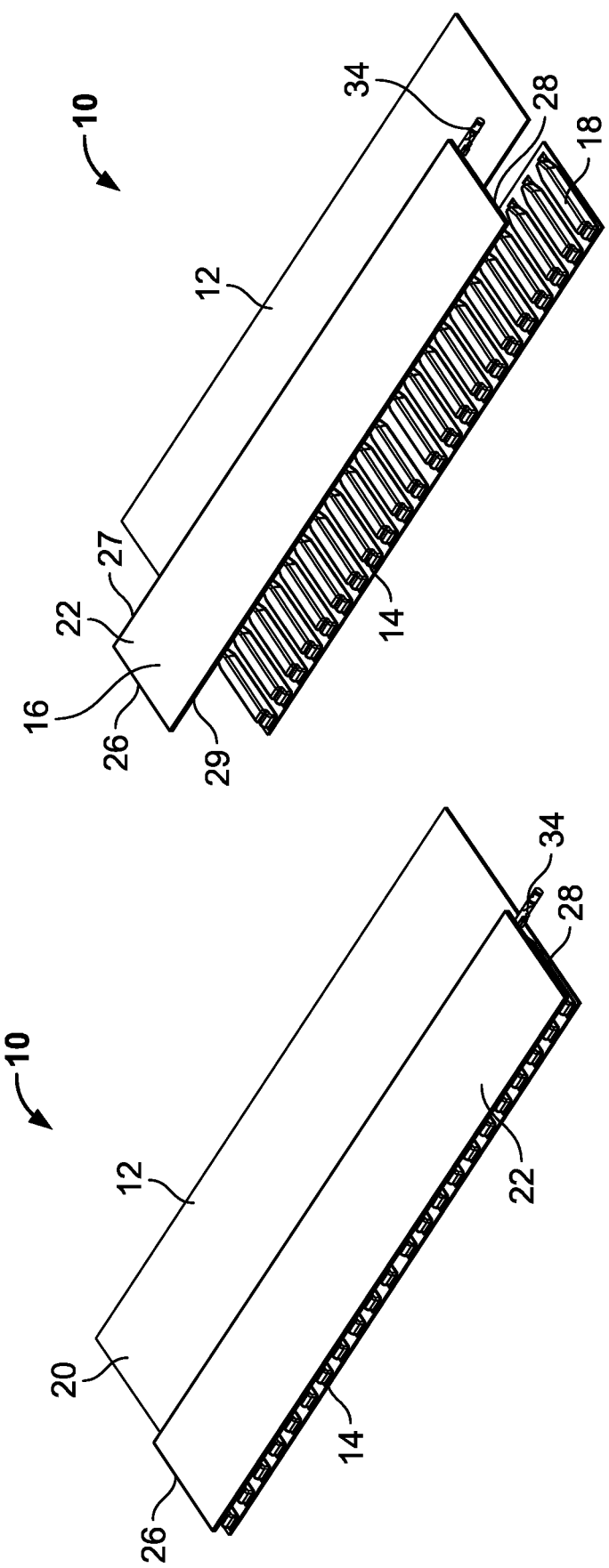

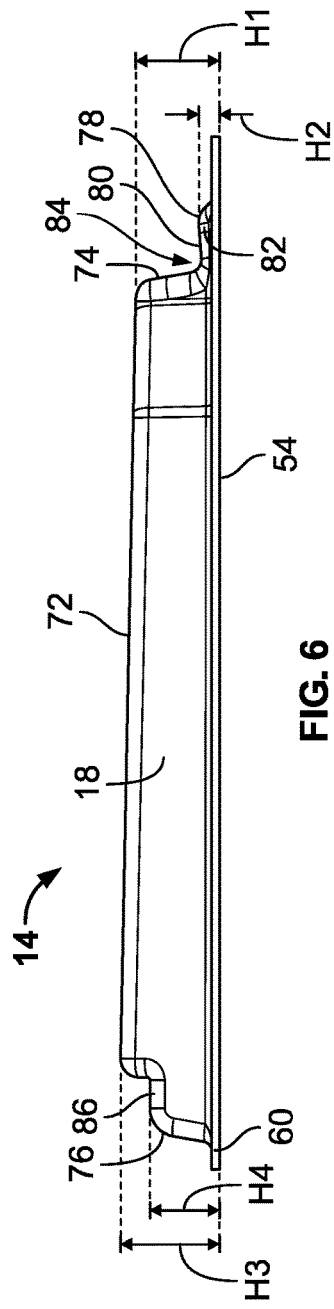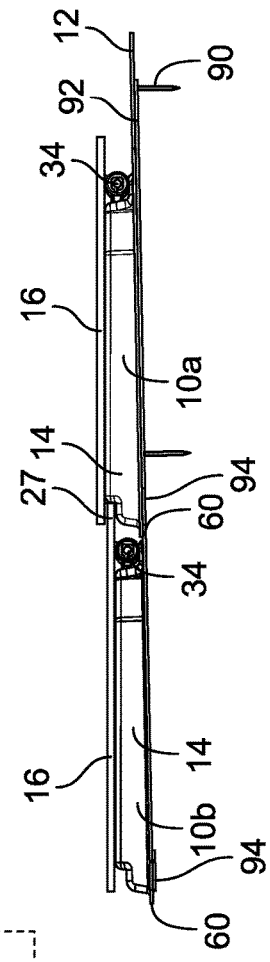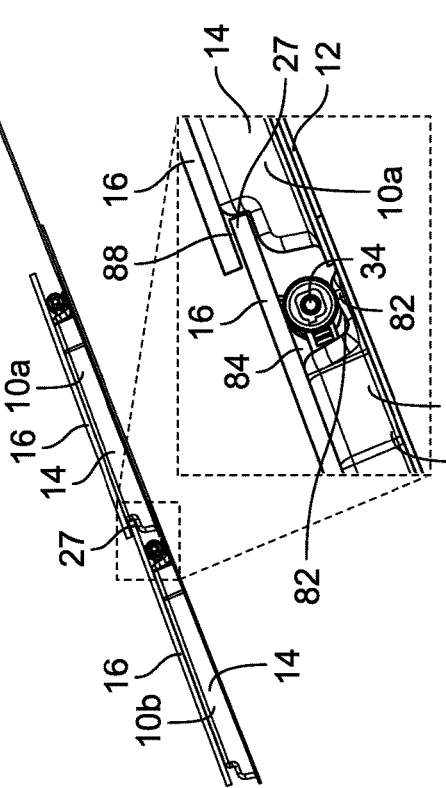

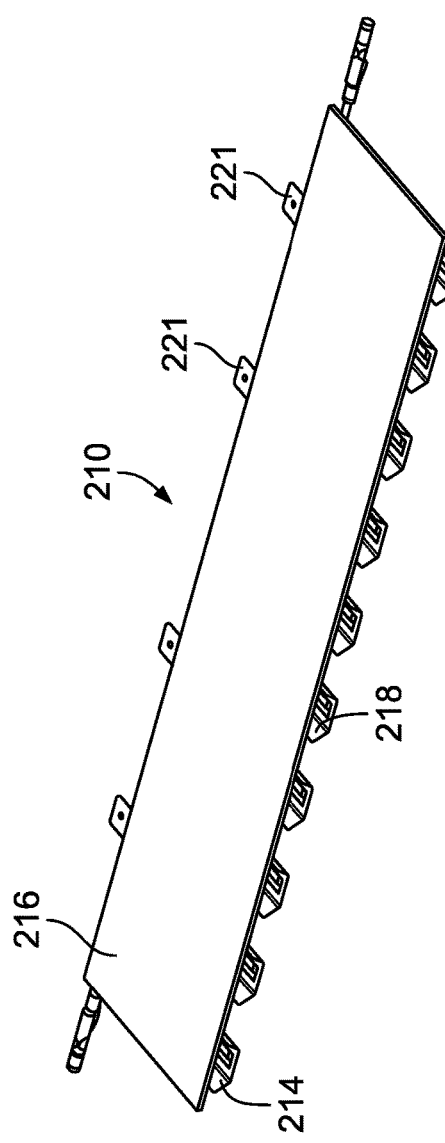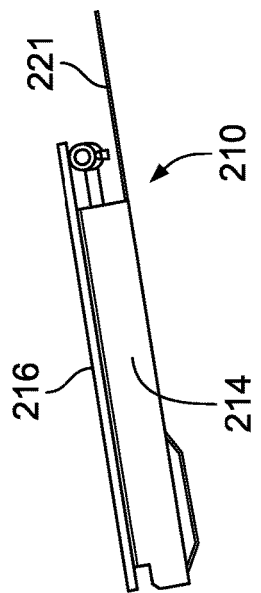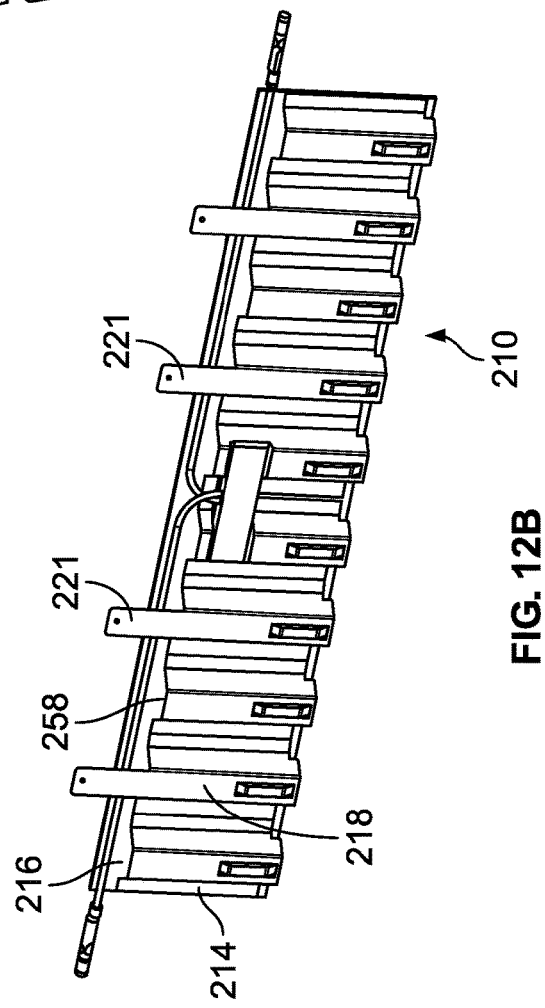

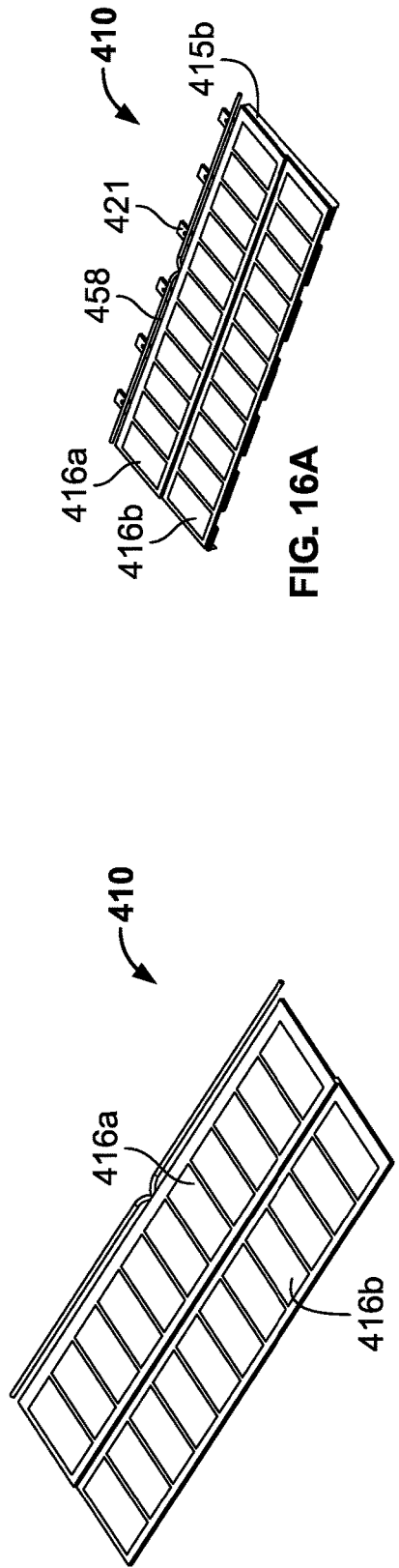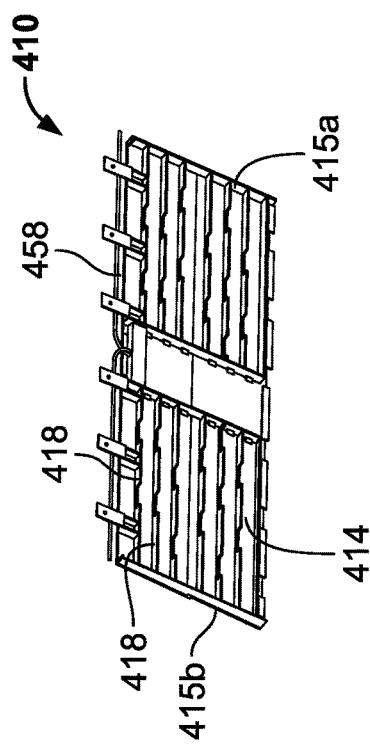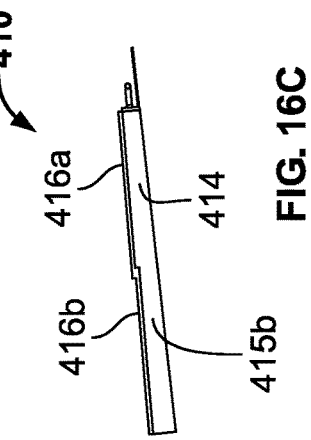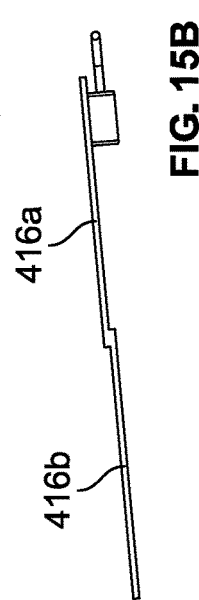

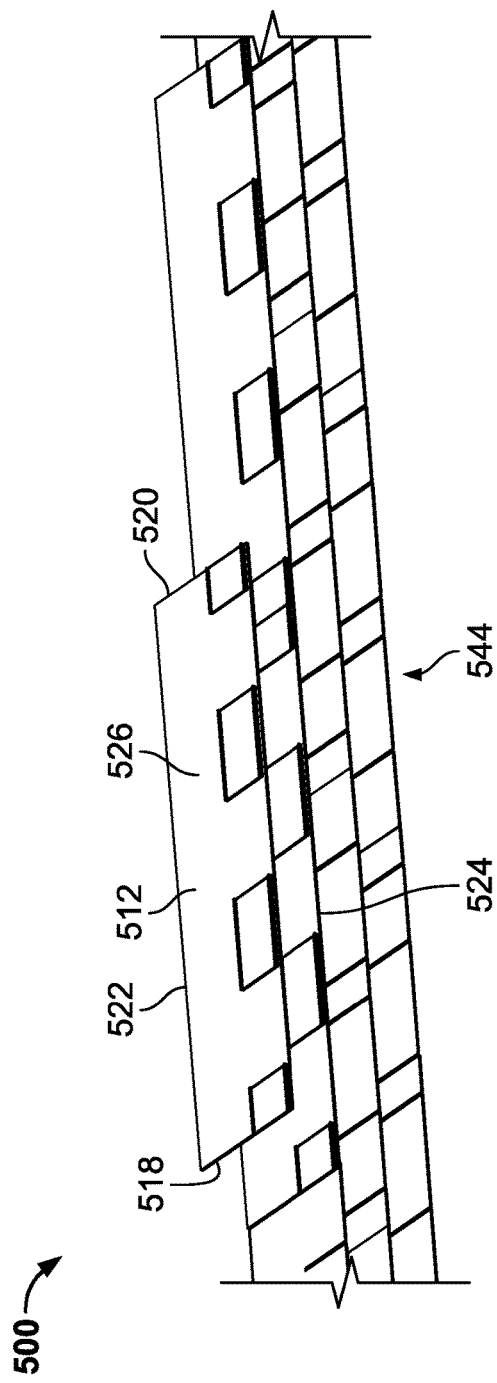
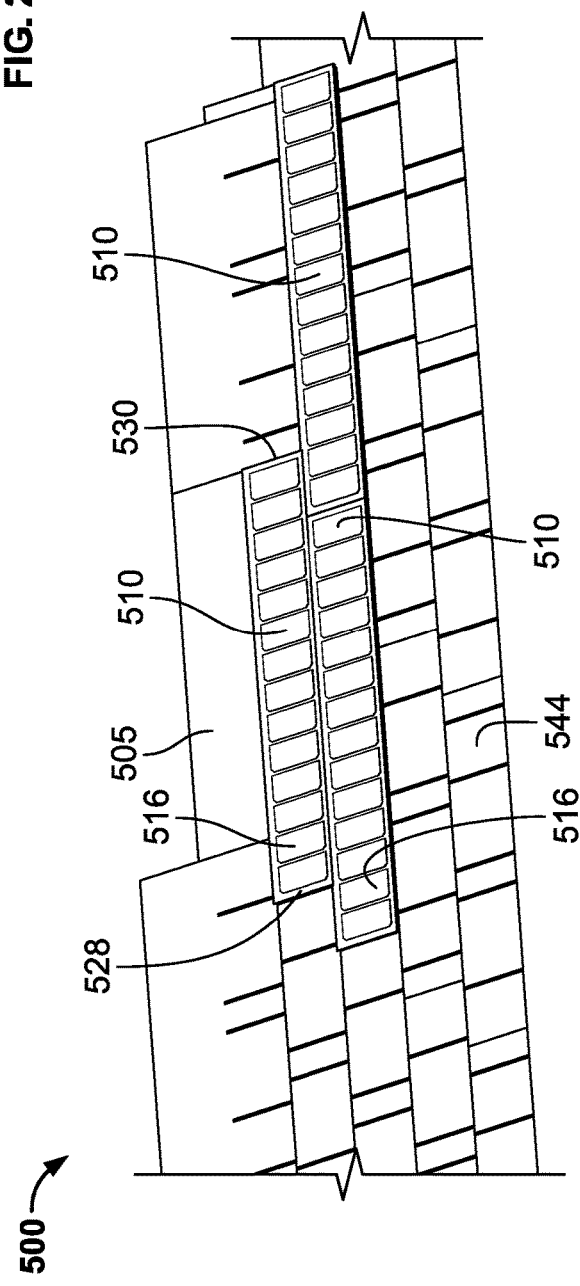

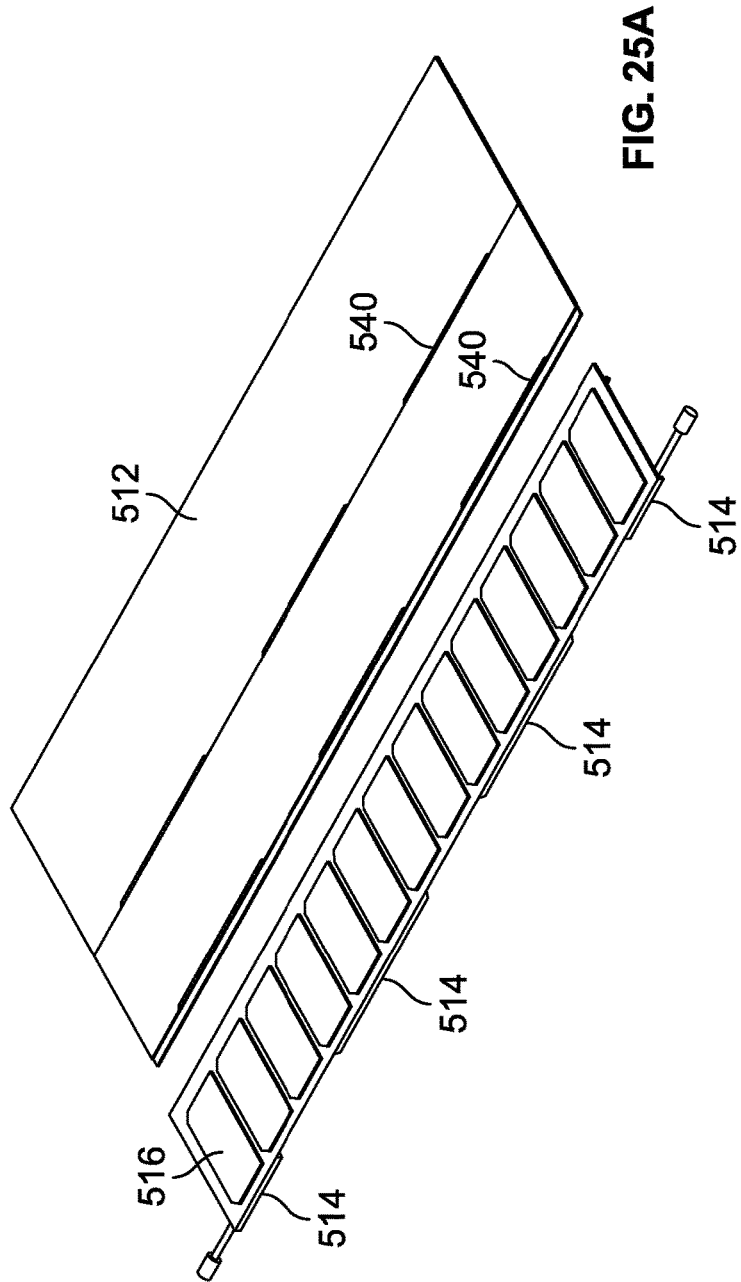
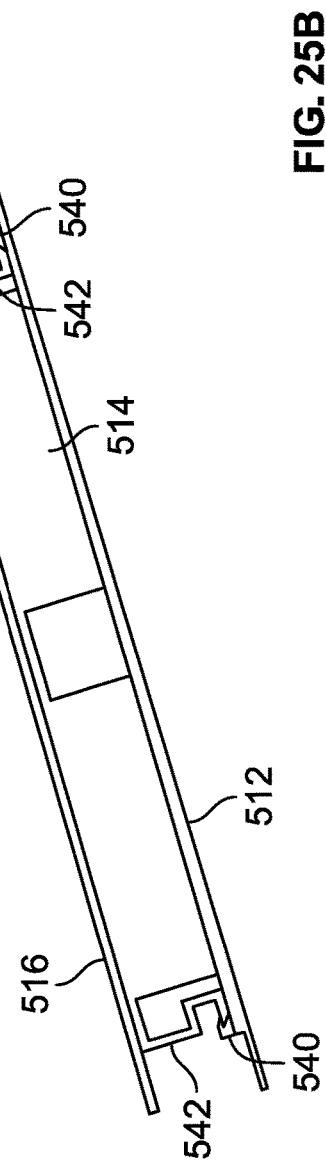
FIG. 25A
FIG. 25B

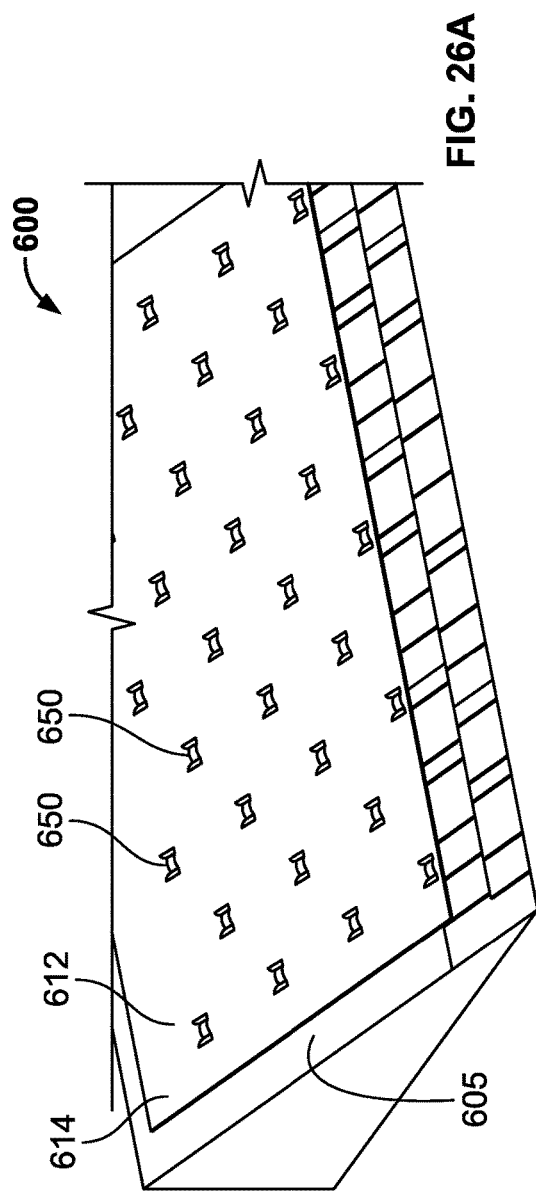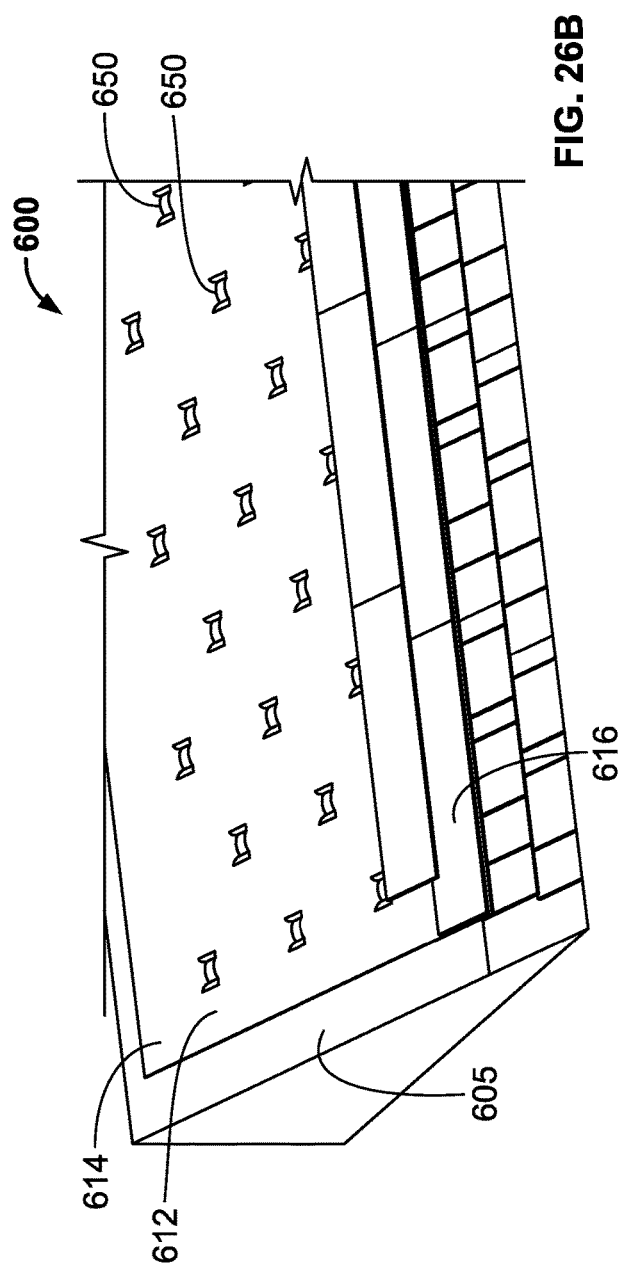

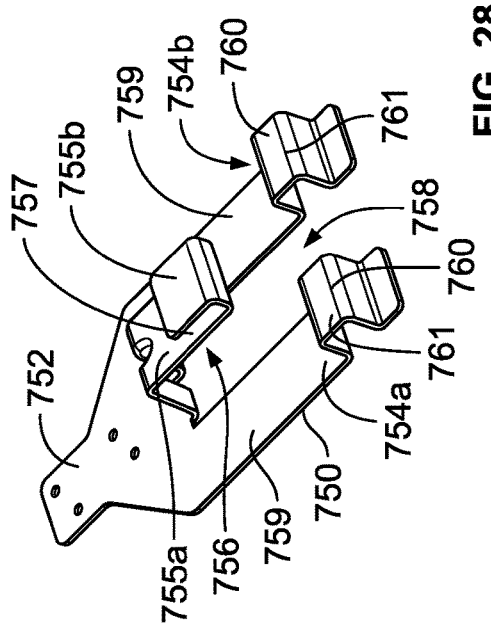
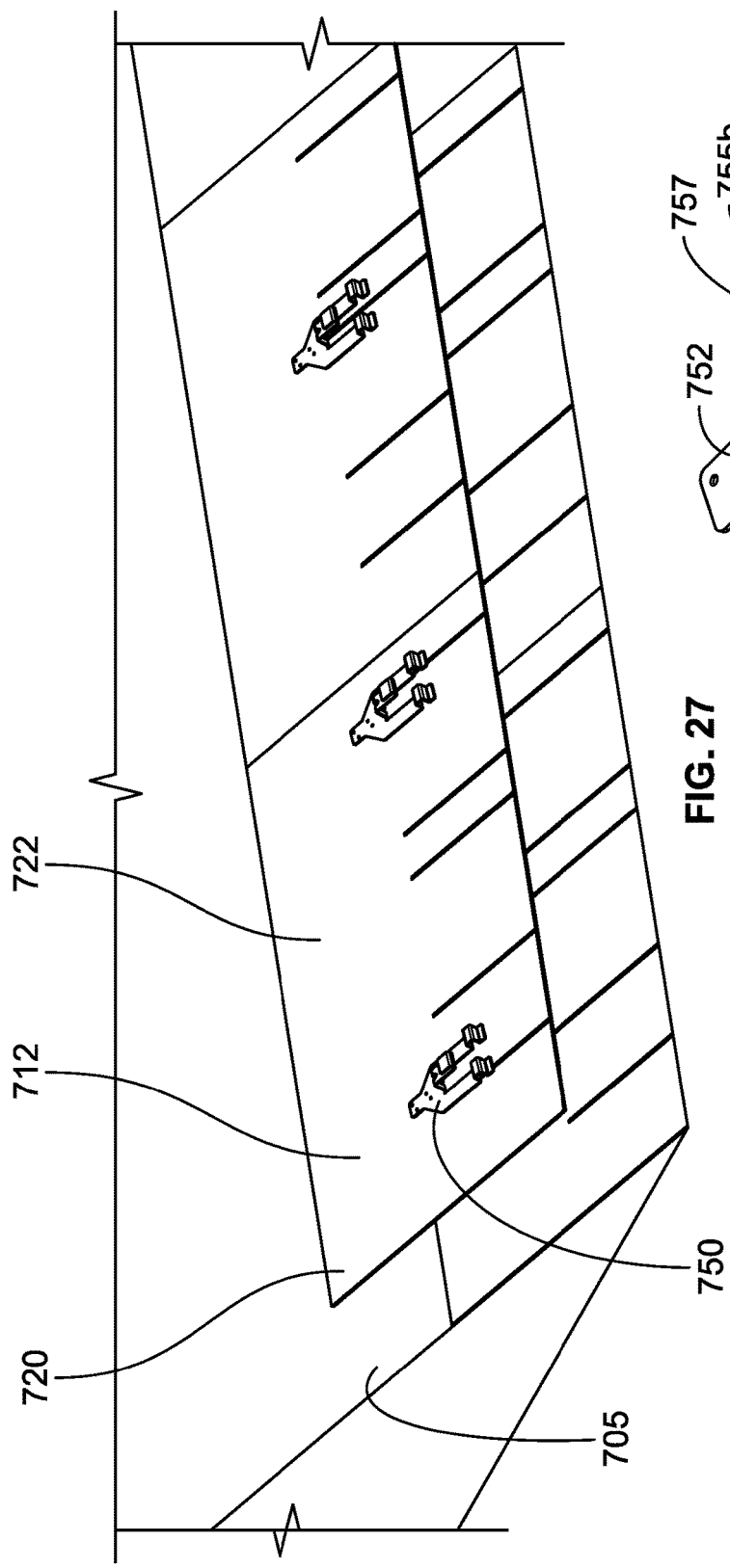
FIG. 27
FIG. 28

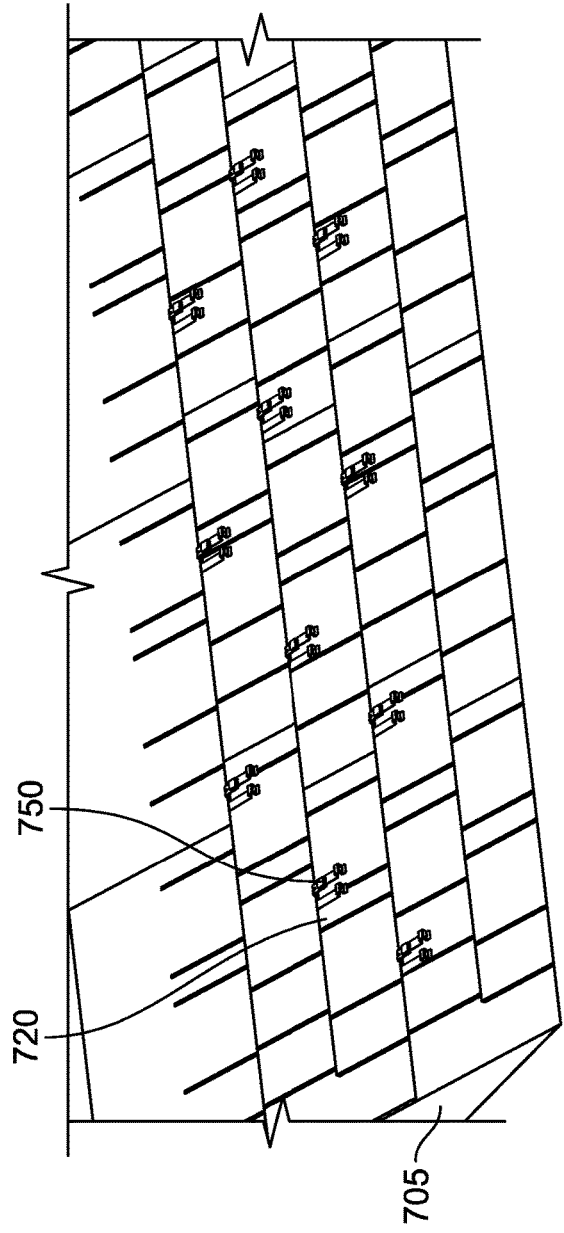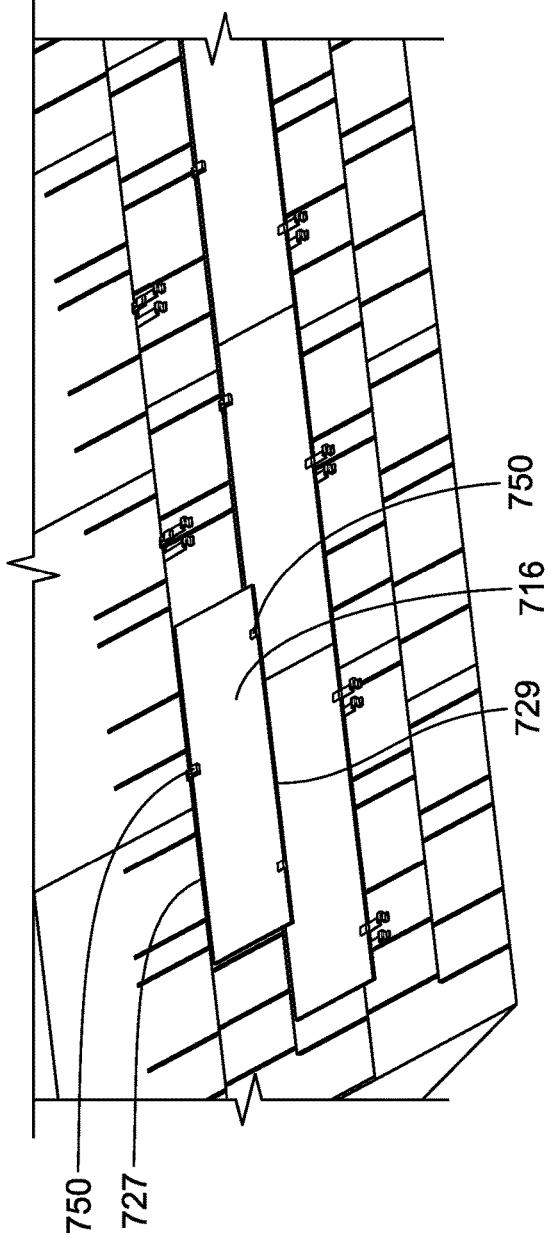

MOUNTING APPARATUS FOR PHOTOVOLTAIC MODULES

CROSS-REFERENCE TO RELATED APPLICATION

This application is a continuation of U.S. patent application Ser. No. 17/941,934, filed Sep. 9, 2022, entitled "MOUNTING APPARATUS FOR PHOTOVOLTAIC MODULES," which is a continuation of U.S. patent application Ser. No. 17/501,606, filed Oct. 14, 2021, entitled "MOUNTING APPARATUS FOR PHOTOVOLTAIC MODULES," now U.S. Pat. No. 11,444,569, which claims the benefit of U.S. Provisional Patent Application Ser. No. 63/091,428, filed Oct. 14, 2020, entitled "MOUNTING APPARATUS FOR PHOTOVOLTAIC MODULES," the contents of which are incorporated herein by reference in their entirety.

FIELD OF THE INVENTION

The present invention relates to photovoltaic modules and, more particularly, mounting apparatus for photovoltaic modules for roofing systems and methods for installing same.

BACKGROUND OF THE INVENTION

Photovoltaic systems having solar panels are commonly installed on roofing of structures. What is needed is mounting apparatus for photovoltaic modules having features for efficient installation thereof.

SUMMARY OF THE INVENTION

In some embodiments, a system includes a plurality of photovoltaic modules configured to be installed on a roof deck, each of the photovoltaic modules includes a mat having a first edge, a spacer having a first edge, wherein the first edge of the mat is attached to the first edge of the spacer wherein the spacer includes a plurality of support members, wherein each of the support members includes a first end, a second end opposite the first end, and a first ledge located at the first end, and at least one solar module mounted to the plurality of support members, wherein the at least one solar module of one of the plurality of photovoltaic modules and the first ledge of the one of the plurality of photovoltaic modules form a first space therebetween, wherein the first space is sized and shaped to receive an edge of a solar module of another of the plurality of photovoltaic modules, and wherein the spacer of one of the plurality of photovoltaic modules overlays the mat of another of the plurality of photovoltaic modules.

In some embodiments, the mat includes a first surface, and wherein the spacer overlays the first surface of the mat. In some embodiments, the spacer includes a base, and wherein the plurality of support members extends from the base. In some embodiments, the base of the spacer includes a first surface and the plurality of support members extends outwardly from the first surface of the base. In some embodiments, the spacer includes a first end and a second end opposite the first end, and wherein the plurality of support members extends from the first end to the second end. In some embodiments, each of the plurality of support members is spaced apart from at least an adjacent one other of the plurality of support members. In some embodiments, the spacer includes a plurality of gaps, each of which is formed between a corresponding pair of the plurality of support members, and wherein each of the plurality of gaps is sized and shaped to receive electrical wiring. In some embodiments, at least one of the plurality of gaps is sized and shaped to receive an electrical component. In some embodiments, the spacer includes a third end extending from the first end to the second end, and a fourth end opposite the third end and extending from the first end to the second end, and wherein each of the plurality of support members extends from the third end to the fourth end.

In some embodiments, each of the plurality of support members includes an upper surface, and wherein the at least one solar module is mounted on the upper surface of each of the plurality of support members. In some embodiments, each of the plurality of support members includes a first height measured from the first surface of the base of the spacer to the upper surface of the support member, and the first ledge includes a second height measured from the first surface of the base of the spacer to an upper surface of the first ledge, and wherein the second height is less than the first height. In some embodiments, the at least one solar module and the first ledge form a first space therebetween, and wherein the first space is sized and shaped to receive at least one electrical component. In some embodiments, each of the plurality of support members includes a second ledge located at the second end thereof. In some embodiments, the second ledge includes a third height measured from the first surface of the base of the spacer to an upper surface of the second ledge, and wherein the third height is less than the first height, and wherein the third height is greater than the second height.

In some embodiments, a system includes a roofing layer configured to be installed directly on a roof deck, the roofing layer including a first surface, and a plurality of hooks installed on the first surface wherein the plurality of hooks is arranged in a pattern, wherein the pattern includes a plurality of rows and a plurality of columns; and a plurality of solar modules configured to be attached to the plurality of hooks. In some embodiments, the roofing layer includes a roofing membrane. In some embodiments, each of the plurality of hooks includes a double wing hook. In some embodiments, each of the plurality of hooks includes a mounting portion, a pair of feet extending from the mounting portion, and a hook portion extending from the mounting portion and offset from the pair of feet to form a slot therebetween, wherein a first edge of one of the plurality of solar modules engages the slot of one of the plurality of hooks, and a second edge of the one of the plurality of solar modules engages the hook portion of at least another one of the plurality of hooks. In some embodiments, the roofing layer includes at least one roofing shingle, wherein the roofing shingle includes a head lap, and wherein the mounting portion of at least one of the plurality of hooks is attached to the head lap of a corresponding one of the at least one roofing shingle. In some embodiments, the pattern is a long-staggered pattern.

BRIEF DESCRIPTION OF THE DRAWINGS

FIG. 1 is a top perspective view of an embodiment of a photovoltaic module;

FIG. 2 is an exploded, top perspective view of the photovoltaic module of FIG. 1;

FIG. 6 is a side elevational view of the spacer shown in FIGS. 5A and 5B;

FIGS. 7 through 9 are side elevational views of a plurality of photovoltaic modules shown in FIG. 1, the modules installed on a roof deck and interlocked with one another;

FIGS. 12A through 12C are top perspective, bottom perspective and side elevational views of an embodiment of a photovoltaic module;

FIGS. 15A and 15B are top perspective and side elevational views of an embodiment of a solar module;

FIGS. 16A through 16C are top perspective, bottom perspective and side elevational views of an embodiment of a photovoltaic module;

FIGS. 20 through 22 are top perspective views of an embodiment of a system of mounting mats, roofing shingles and solar modules installed on a roof deck;

FIGS. 25A and 25B are top perspective and side elevational views of an embodiment of a photovoltaic module;

FIGS. 26A and 26B are top perspective views of an embodiment of a system of solar modules installed on a roof deck; and FIGS. 27 through 30 are top perspective views of an embodiment of a system of hook members for installing solar modules on a roof deck.

DETAILED DESCRIPTION

Figure 3:
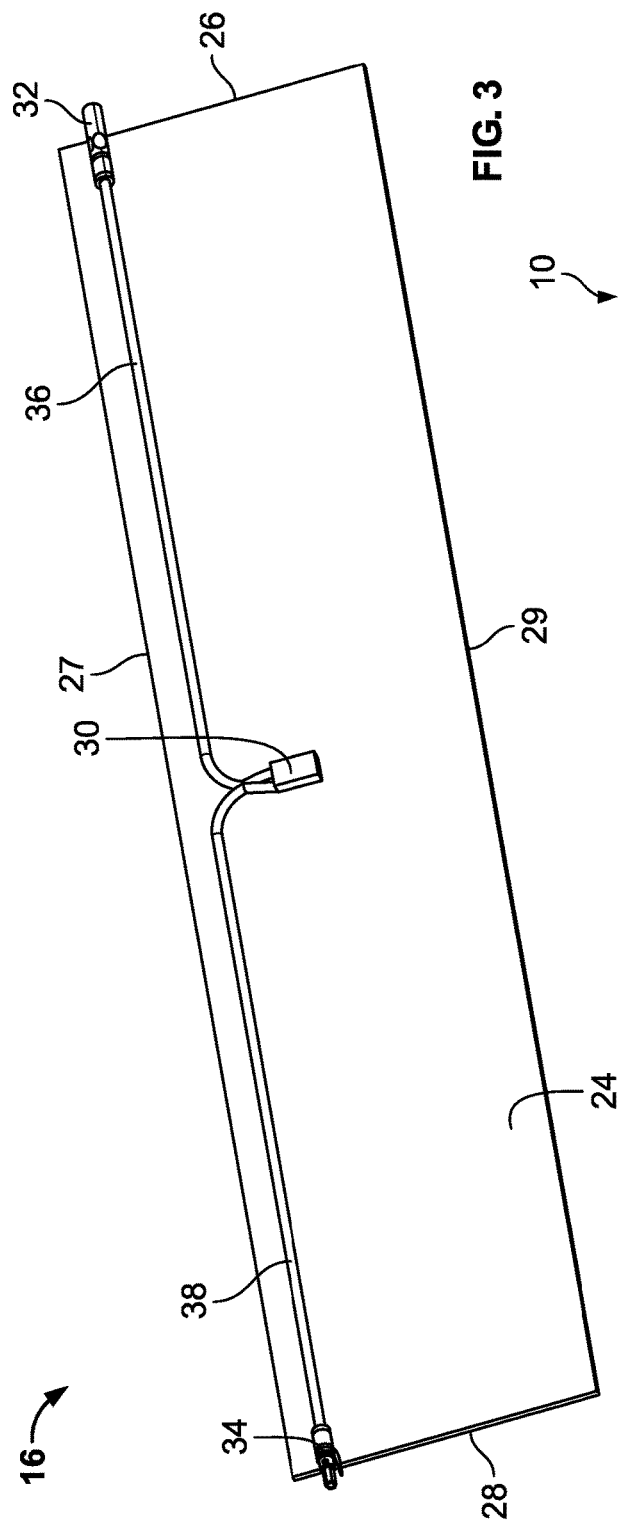
FIG. 3 is a bottom perspective view of a solar module employed by the photovoltaic module of FIG. 1.

Referring to FIGS. 1 and 2, in some embodiments, a photovoltaic module 10 includes a mat 12, a spacer 14 juxtaposed with the mat 12, and a solar module 16 mounted to the spacer 14. In some embodiments, the solar module 16 is elevated relative to the mat 12. In some embodiments, the spacer 14 includes a plurality of support members 18. In some embodiments, the solar module 16 is mounted to the plurality of support members 18. In some embodiments, the mat 12 includes a first surface 20 and the spacer 14 overlays the first surface 20 of the mat 12. In some embodiments, the photovoltaic module 10 is configured to be installed on a roof deck. In some embodiments, the roof deck is a component of a roofing system. In some embodiments, the roofing system includes a plurality of roofing shingles installed on the roof deck. In some embodiments, the roofing shingles include asphalt shingles. In some embodiments, the roofing system includes roof tiles. In some embodiments, the roofing system includes terracotta roof tiles.

Referring to FIGS. 1 through 3, in some embodiments, at least one solar module 16 includes a first surface 22, a second surface 24 opposite the first surface 22, a first end 26, a second end 28 opposite the first end 26, a first edge 27 extending from the first end 26 to the second end 28, and a second edge 29 opposite the first edge 27 and extending from the first end 26 to the second end 28. In some embodiments, a junction box 30 is mounted to the second surface 24. In some embodiments, the junction box 30 is mounted on the second surface 24 proximate to the first edge 27. In some embodiments, a first electrical connector 32 is mounted to the second surface 24. In some embodiments, a second electrical connector 34 is mounted to the second surface 24. In some embodiments, the first and second electrical connectors 32, 34 are mounted to the second surface 24 proximate to the first edge 27. In some embodiments, the first electrical connector 32 is a female connector. In some embodiments, the second electrical connector 34 is a male connector. In some embodiments, the first electrical connector 32 extends outwardly from the first end 26. In some embodiments, the second electrical connector 34 extends outwardly from the second end 28. In some embodiments, the first and second electrical connectors 32, 34 are electrically connected to the junction box 30 by electrical wires 36, 38, respectively.

Figure 4:
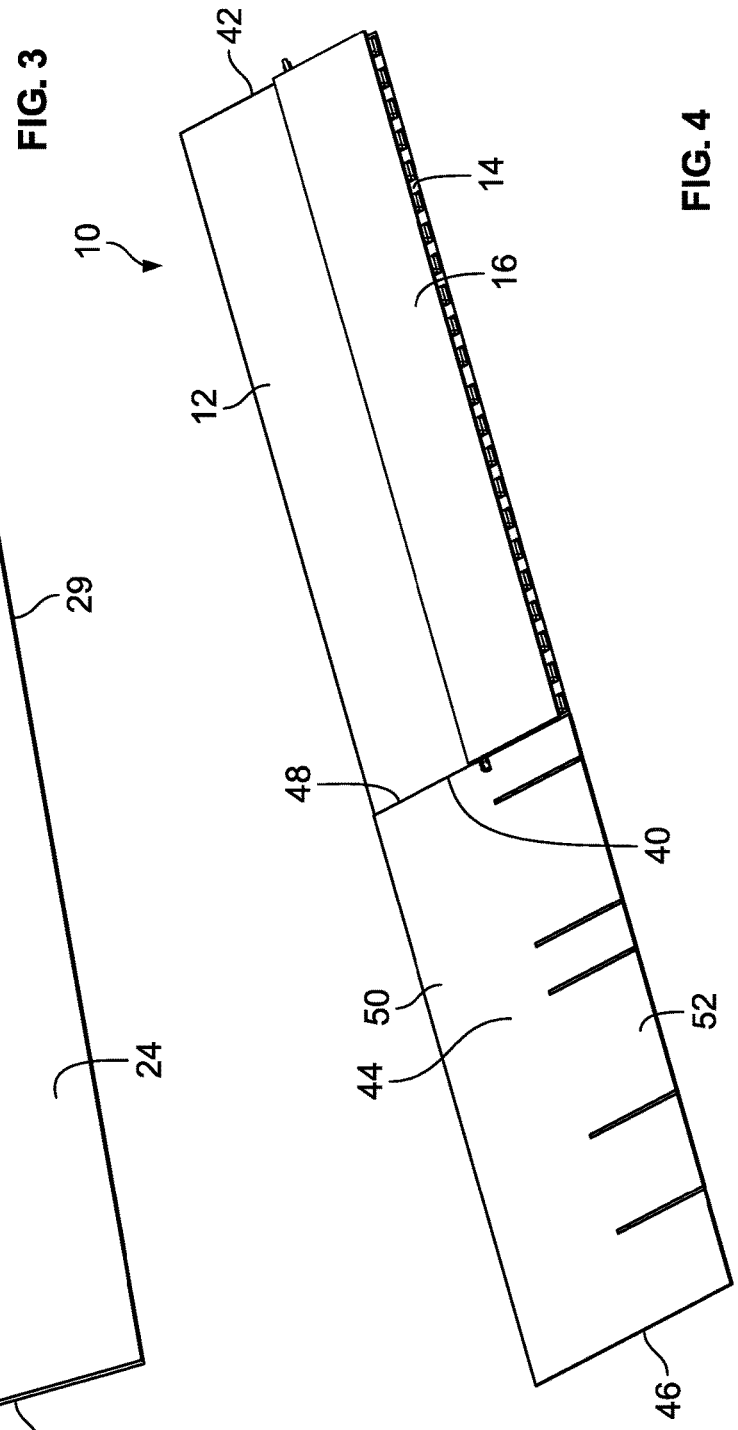
FIG. 4 is a top perspective view of the photovoltaic module of FIG. 1 juxtaposed with a shingle.

Referring to FIG. 4, in some embodiments, the photovoltaic module 10 includes a first edge 40 and a second edge 42 opposite the first edge 40. In some embodiments, a roofing shingle 44 includes a first edge 46 and a second edge 48 opposite the first edge 46. In some embodiments, the second edge 48 of the roofing shingle 44 is juxtaposed with the first edge 40 of the photovoltaic module 10. In some embodiments, the first edge 46 of the roofing shingle 44 is juxtaposed with the second edge 42 of the photovoltaic module 10. In some embodiments, the roofing shingle 44 includes a head lap 50 and a reveal portion 52. In some embodiments, the head lap 50 is aligned with the mat 12 of the photovoltaic module 10, while the reveal portion 52 is aligned with the solar module 16.

Figure 5A:
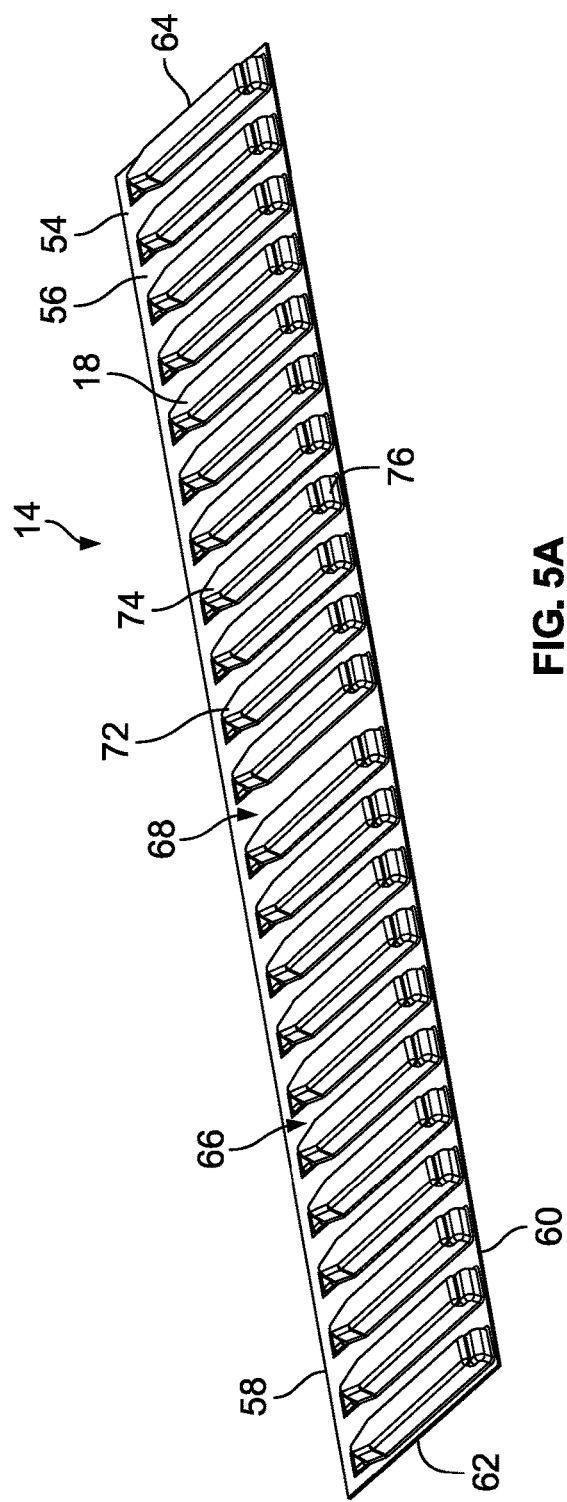
FIGS. 5A and 5B are top and bottom perspective views of a spacer employed by the photovoltaic module of FIG. 1.
Figure 5B:
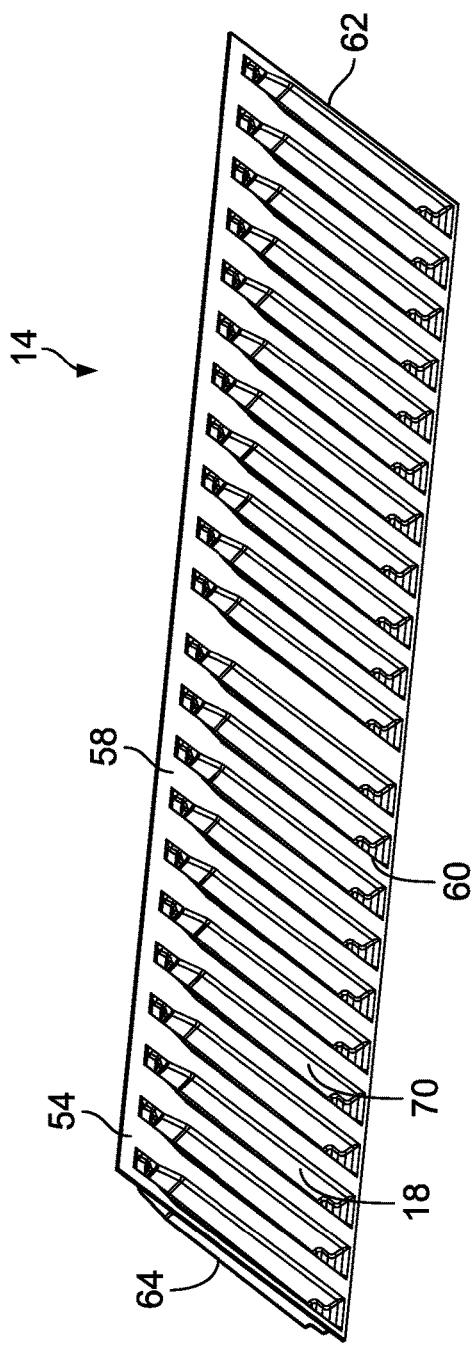

Referring to FIGS. 5A and 5B, the spacer 14 includes a base 54 having a first surface 56. In some embodiments, the plurality of support members 18 extends outwardly from the first surface 56 of the base 54. In some embodiments, the spacer 14 includes a first edge 58 and a second edge 60 opposite the first edge 58. In some embodiments, the mat 12 is adjacent to the first edge 58 of the base 54 of the spacer 14. In some embodiments, the mat 12 is attached to the first edge 58 of the base 54 of the spacer 14.

In some embodiments, the mat 12 is composed of a polymer. In some embodiments, the mat 12 includes thermoplastic polyolefin (TPO). In other embodiments, the mat 12 is composed of polyethylene terephthalate (PET), polyethylene naphthalate (PEN), polyetheretherketone (PEEK), polyaryletherketone (PAEK), polyarylate (PAR), polyetherimide (PEI), polyarylsulfone (PAS), polyethersulfone (PES), polyamideimide (PAI), or polyimide; polyvinyl chloride (PVC); ethylene propylene diene monomer (EPDM) rubber; silicone rubber; fluoropolymers-ethylene tetrafluoroethylene (ETFE), polyvinylidene fluoride (PVDF), tetrafluoroethylene-hexafluoropropylene copolymers (FEP), and tetrafluoroethylene-hexafluoropropylene-vinylidene fluoride copolymers (THV), or blends thereof.

Still referring to FIGS. 5A and 5B, in an embodiment, the spacer 14 includes a first end 62 and a second end 64 opposite the first end 62. In some embodiments, the plurality of support members 18 extends from the first end 62 to the second end 64. In some embodiments, each of the plurality of support members 18 is spaced apart from at least an adjacent one other of the plurality of support members 18. In some embodiments, the spacer 14 includes a plurality of gaps 66, each of which is formed between a corresponding pair of the plurality of support members 18. In some embodiments, each of the plurality of gaps 66 is sized and shaped to receive electrical wiring. In some embodiments, electrical wiring may be routed through at least one of the plurality of gaps 66. In some embodiments, each of the plurality of gaps 66 is configured to permit a flow water to travel and drain therethrough. In some embodiments, at least one gap 68 of the plurality of gaps 66 is sized and shaped to receive an electrical component. In some embodiments, the electrical component is the junction box 30. In some embodiments, the at least one gap 68 of the plurality of gaps 66 receives the junction box 30 when the solar module 16 is positioned on the spacer 14. In some embodiments, each of the plurality of support members 18 extends intermediate the first edge 58 and the second edge 60. In some embodiments, each of the plurality of support members 18 is substantially parallel to one another. In some embodiments, each of the plurality of support members 18 is hollow and includes an interior portion 70. In some embodiments, the interior portions 70 result in a weight reduction of the spacer 14.

Referring to FIGS. 6 through 8, each of the plurality of support members 18 includes an upper surface 72. In some embodiments, the solar module 16 is mounted on the upper surface 72 of each of the plurality of support members 18. In some embodiments, the solar module 16 is mounted on the upper surface 72 of at least one of the plurality of support members 18. In some embodiments, the upper surface 72 extends obliquely relative to the mat 12.

In some embodiments, the upper surface 72 extends obliquely in a range of 0.1 degree to 5 degrees relative to the base 54. In some embodiments, the upper surface 72 extends obliquely in a range of 0.1 degree to 4.5 degrees relative to the base 54. In some embodiments, the upper surface 72 extends obliquely in a range of 0.1 degree to 4 degrees relative to the base 54. In some embodiments, the upper surface 72 extends obliquely in a range of 0.1 degree to 3.5 degrees relative to the base 54. In some embodiments, the upper surface 72 extends obliquely in a range of 0.1 degree to 3 degrees relative to the base 54. In some embodiments, the upper surface 72 extends obliquely in a range of 0.1 degree to 2.5 degrees relative to the base 54. In some embodiments, the upper surface 72 extends obliquely in a range of 0.1 degree to 2 degrees relative to the base 54. In some embodiments, the upper surface 72 extends obliquely in a range of 0.1 degree to 1.5 degrees relative to the base 54. In some embodiments, the upper surface 72 extends obliquely in a range of 0.1 degree to 1 degree relative to the base 54. In some embodiments, the upper surface 72 extends obliquely in a range of 0.1 degree to 0.5 degree relative to the base 54.

In some embodiments, the upper surface 72 extends obliquely in a range of 0.5 degree to 5 degrees relative to the base 54. In some embodiments, the upper surface 72 extends obliquely in a range of 0.5 degree to 4.5 degrees relative to the base 54. In some embodiments, the upper surface 72 extends obliquely in a range of 0.5 degree to 4 degrees relative to the base 54. In some embodiments, the upper surface 72 extends obliquely in a range of 0.5 degree to 3.5 degrees relative to the base 54. In some embodiments, the upper surface 72 extends obliquely in a range of 0.5 degree to 3 degrees relative to the base 54. In some embodiments, the upper surface 72 extends obliquely in a range of 0.5 degree to 2.5 degrees relative to the base 54. In some embodiments, the upper surface 72 extends obliquely in a range of 0.5 degree to 2 degrees relative to the base 54. In some embodiments, the upper surface 72 extends obliquely in a range of 0.5 degree to 1.5 degrees relative to the base 54. In some embodiments, the upper surface 72 extends obliquely in a range of 0.5 degree to 1 degree relative to the base 54.

In some embodiments, the upper surface 72 extends obliquely in a range of 1 degree to 5 degrees relative to the base 54. In some embodiments, the upper surface 72 extends obliquely in a range of 1 degree to 4.5 degrees relative to the base 54. In some embodiments, the upper surface 72 extends obliquely in a range of 1 degree to 4 degrees relative to the base 54. In some embodiments, the upper surface 72 extends obliquely in a range of 1 degree to 3.5 degrees relative to the base 54. In some embodiments, the upper surface 72 extends obliquely in a range of 1 degree to 3 degrees relative to the base 54. In some embodiments, the upper surface 72 extends obliquely in a range of 1 degree to 2.5 degrees relative to the base 54. In some embodiments, the upper surface 72 extends obliquely in a range of 1 degree to 2 degrees relative to the base 54. In some embodiments, the upper surface 72 extends obliquely in a range of 1 degree to 1.5 degrees relative to the base 54.

In some embodiments, the upper surface 72 extends obliquely in a range of 1.5 degrees to 5 degrees relative to the base 54. In some embodiments, the upper surface 72 extends obliquely in a range of 1.5 degrees to 4.5 degrees relative to the base 54. In some embodiments, the upper surface 72 extends obliquely in a range of 1.5 degrees to 4 degrees relative to the base 54. In some embodiments, the upper surface 72 extends obliquely in a range of 1.5 degrees to 3.5 degrees relative to the base 54. In some embodiments, the upper surface 72 extends obliquely in a range of 1.5 degrees to 3 degrees relative to the base 54. In some embodiments, the upper surface 72 extends obliquely in a range of 1.5 degrees to 2.5 degrees relative to the base 54. In some embodiments, the upper surface 72 extends obliquely in a range of 1.5 degrees to 2 degrees relative to the base 54.

In some embodiments, the upper surface 72 extends obliquely in a range of 2 degrees to 5 degrees relative to the base 54. In some embodiments, the upper surface 72 extends obliquely in a range of 2 degrees to 4.5 degrees relative to the base 54. In some embodiments, the upper surface 72 extends obliquely in a range of 2 degrees to 4 degrees relative to the base 54. In some embodiments, the upper surface 72 extends obliquely in a range of 2 degrees to 3.5 degrees relative to the base 54. In some embodiments, the upper surface 72 extends obliquely in a range of 2 degrees to 3 degrees relative to the base 54. In some embodiments, the upper surface 72 extends obliquely in a range of 2 degrees to 2.5 degrees relative to the base 54.

In some embodiments, the upper surface 72 extends obliquely in a range of 2.5 degrees to 5 degrees relative to the base 54. In some embodiments, the upper surface 72 extends obliquely in a range of 2.5 degrees to 4.5 degrees relative to the base 54. In some embodiments, the upper surface 72 extends obliquely in a range of 2.5 degrees to 4 degrees relative to the base 54. In some embodiments, the upper surface 72 extends obliquely in a range of 2.5 degrees to 3.5 degrees relative to the base 54. In some embodiments, the upper surface 72 extends obliquely in a range of 2.5 degrees to 3 degrees relative to the base 54.

In some embodiments, the upper surface 72 extends obliquely in a range of 3 degrees to 5 degrees relative to the base 54. In some embodiments, the upper surface 72 extends obliquely in a range of 3 degrees to 4.5 degrees relative to the base 54. In some embodiments, the upper surface 72 extends obliquely in a range of 3 degrees to 4 degrees relative to the base 54. In some embodiments, the upper surface 72 extends obliquely in a range of 3 degrees to 3.5 degrees relative to the base 54.

In some embodiments, the upper surface 72 extends obliquely in a range of 3.5 degrees to 5 degrees relative to the base 54. In some embodiments, the upper surface 72 extends obliquely in a range of 3.5 degrees to 4.5 degrees relative to the base 54. In some embodiments, the upper surface 72 extends obliquely in a range of 3.5 degrees to 4 degrees relative to the base 54.

In some embodiments, the upper surface 72 extends obliquely in a range of 4 degrees to 5 degrees relative to the base 54. In some embodiments, the upper surface 72 extends obliquely in a range of 4 degrees to 4.5 degrees relative to the base 54. In some embodiments, the upper surface 72 extends obliquely in a range of 4.5 degrees to 5 degrees relative to the base 54.

In some embodiments, the upper surface 72 extends obliquely 0.1 degree relative to the base 54. In some embodiments, the upper surface 72 extends obliquely 0.5 degree relative to the base 54. In some embodiments, the upper surface 72 extends obliquely 1 degree relative to the base 54. In some embodiments, the upper surface 72 extends obliquely 1.5 degrees relative to the base 54. In some embodiments, the upper surface 72 extends obliquely 2 degrees relative to the base 54. In some embodiments, the upper surface 72 extends obliquely 2.5 degrees relative to the base 54. In some embodiments, the upper surface 72 extends obliquely 3 degrees relative to the base 54. In some embodiments, the upper surface 72 extends obliquely 3.5 degrees relative to the base 54. In some embodiments, the upper surface 72 extends obliquely 4 degrees relative to the base 54. In some embodiments, the upper surface 72 extends obliquely 4.5 degrees relative to the base 54. In some embodiments, the upper surface 72 extends obliquely 5 degrees relative to the base 54.

Still referring to FIGS. 6 through 8, In some embodiments, each of the plurality of support members 18 includes a first end 74, a second end 76 opposite the first end 74, and a ledge 78 located at the first end 74 of the support member 18. In some embodiments, each of the plurality of support members 18 includes a first height H1 measured from the base 54 of the spacer 14 to the upper surface 72 of the support member 18 proximate to the first end 74, and the ledge 78 includes a second height H2 measured from the base 54 of the spacer 14 to an upper surface 80 of the ledge 78. In some embodiments, the second height H2 is less than the first height H1. In some embodiments, the ledge 78 includes a raised bump 82. In some embodiments, the solar module 16 and the ledge 78 form a first space 84 therebetween. In some embodiments, the first space 84 is sized and shaped to receive at least one electrical component. In some embodiments, the at least one electrical component includes at least the junction box 30. In some embodiments, the at least one electrical component includes at least one of the first and second electrical connectors 32, 34. In some embodiments, the at least one electrical component includes at least one of the first and second electrical wiring 36, 38. In some embodiments, the raised bump 82 is configured to elevate the first and second electrical connectors 32, 34 relative to the roof deck to prevent water from reaching the connectors 32, 34.

Still referring to FIGS. 6 through 8, in an embodiment, each of the plurality of support members 18 includes a ledge 86 located at the second end 76 thereof. In some embodiments, each of the plurality of support members 18 includes a third height H3 measured from the base 54 of the spacer 14 to the upper surface 72 of the support member 18 proximate to the second end 76, and the ledge 86 includes a fourth height H4 measured from the base 54 of the spacer 14 to an upper surface 72 of the ledge 86. In some embodiments, the third height H3 is greater than the first height H1. In some embodiments, the third height H3 is greater than the second height H2. In some embodiments, the third height H3 is greater than the fourth height H4. In some embodiments, the fourth height H4 is less than the first height H1. In some embodiments, the fourth height H4 is greater than the second height H2.

In some embodiments, the first height H1 is in a range of 10 mm to 20 mm. In some embodiments, the first height H1 is in a range of 10 mm to 19 mm. In some embodiments, the first height H1 is in a range of 10 mm to 18 mm. In some embodiments, the first height H1 is in a range of 10 mm to 17 mm. In some embodiments, the first height H1 is in a range of 10 mm to 16 mm. In some embodiments, the first height H1 is in a range of 10 mm to 15 mm. In some embodiments, the first height H1 is in a range of 10 mm to 14 mm. In some embodiments, the first height H1 is in a range of 10 mm to 13 mm. In some embodiments, the first height H1 is in a range of 10 mm to 12 mm. In some embodiments, the first height H1 is in a range of 10 mm to 11 mm.

In some embodiments, the first height H1 is in a range of 11 mm to 20 mm. In some embodiments, the first height H1 is in a range of 11 mm to 19 mm. In some embodiments, the first height H1 is in a range of 11 mm to 18 mm. In some embodiments, the first height H1 is in a range of 11 mm to 17 mm. In some embodiments, the first height H1 is in a range of 11 mm to 16 mm. In some embodiments, the first height H1 is in a range of 11 mm to 15 mm. In some embodiments, the first height H1 is in a range of 11 mm to 14 mm. In some embodiments, the first height H1 is in a range of 11 mm to 13 mm. In some embodiments, the first height H1 is in a range of 11 mm to 12 mm.

In some embodiments, the first height H1 is in a range of 12 mm to 20 mm. In some embodiments, the first height H1 is in a range of 12 mm to 19 mm. In some embodiments, the first height H1 is in a range of 12 mm to 18 mm. In some embodiments, the first height H1 is in a range of 12 mm to 17 mm. In some embodiments, the first height H1 is in a range of 12 mm to 16 mm. In some embodiments, the first height H1 is in a range of 12 mm to 15 mm. In some embodiments, the first height H1 is in a range of 12 mm to 14 mm. In some embodiments, the first height H1 is in a range of 12 mm to 13 mm.

In some embodiments, the first height H1 is in a range of 13 mm to 20 mm. In some embodiments, the first height H1 is in a range of 13 mm to 19 mm. In some embodiments, the first height H1 is in a range of 13 mm to 18 mm. In some embodiments, the first height H1 is in a range of 13 mm to 17 mm. In some embodiments, the first height H1 is in a range of 13 mm to 16 mm. In some embodiments, the first height H1 is in a range of 13 mm to 15 mm. In some embodiments, the first height H1 is in a range of 13 mm to 14 mm.

In some embodiments, the first height H1 is in a range of 14 mm to 20 mm. In some embodiments, the first height H1 is in a range of 14 mm to 19 mm. In some embodiments, the first height H1 is in a range of 14 mm to 18 mm. In some embodiments, the first height H1 is in a range of 14 mm to 17 mm. In some embodiments, the first height H1 is in a range of 14 mm to 16 mm. In some embodiments, the first height H1 is in a range of 14 mm to 15 mm.

In some embodiments, the first height H1 is in a range of 15 mm to 20 mm. In some embodiments, the first height H1 is in a range of 15 mm to 19 mm. In some embodiments, the first height H1 is in a range of 15 mm to 18 mm. In some embodiments, the first height H1 is in a range of 15 mm to 17 mm. In some embodiments, the first height H1 is in a range of 15 mm to 16 mm.

In some embodiments, the first height H1 is in a range of 16 mm to 20 mm. In some embodiments, the first height H1 is in a range of 16 mm to 19 mm. In some embodiments, the first height H1 is in a range of 16 mm to 18 mm. In some embodiments, the first height H1 is in a range of 16 mm to 17 mm.

In some embodiments, the first height H1 is in a range of 17 mm to 20 mm. In some embodiments, the first height H1 is in a range of 17 mm to 19 mm. In some embodiments, the first height H1 is in a range of 17 mm to 18 mm. In some embodiments, the first height H1 is in a range of 18 mm to 20 mm. In some embodiments, the first height H1 is in a range of 18 mm to 19 mm. In some embodiments, the first height H1 is in a range of 19 mm to 20 mm.

In some embodiments, the first height H1 is 10 mm. In some embodiments, the first height H1 is 11 mm. In some embodiments, the first height H1 is 12 mm. In some embodiments, the first height H1 is 13 mm. In some embodiments, the first height H1 is 14 mm. In some embodiments, the first height H1 is 15 mm. In some embodiments, the first height H1 is 16 mm.

In some embodiments, the first height H1 is 17 mm. In some embodiments, the first height H1 is 18 mm. In some embodiments, the first height H1 is 19 mm. In some embodiments, the first height H1 is 20 mm.

In some embodiments, the second height H2 is in a range of 1 mm to 5 mm. In some embodiments, the second height H2 is in a range of 1 mm to 4 mm. In some embodiments, the second height H2 is in a range of 1 mm to 3 mm. In some embodiments, the second height H2 is in a range of 1 mm to 2 mm.

In some embodiments, the second height H2 is in a range of 2 mm to 5 mm. In some embodiments, the second height H2 is in a range of 2 mm to 4 mm. In some embodiments, the second height H2 is in a range of 2 mm to 3 mm. In some embodiments, the second height H2 is in a range of 3 mm to 5 mm. In some embodiments, the second height H2 is in a range of 3 mm to 4 mm. In some embodiments, the second height H2 is in a range of 4 mm to 5 mm.

In some embodiments, the second height H2 is 1 mm. In some embodiments, the second height H2 is 2 mm. In some embodiments, the second height H2 is 3 mm. In some embodiments, the second height H2 is 4 mm. In some embodiments, the second height H2 is 5 mm.

In some embodiments, the third height H3 is in a range of 15 mm to 25 mm. In some embodiments, the third height H3 is in a range of 15 mm to 24 mm. In some embodiments, the third height H3 is in a range of 15 mm to 23 mm. In some embodiments, the third height H3 is in a range of 15 mm to 22 mm. In some embodiments, the third height H3 is in a range of 15 mm to 21 mm. In some embodiments, the third height H3 is in a range of 15 mm to 20 mm. In some embodiments, the third height H3 is in a range of 15 mm to 19 mm. In some embodiments, the third height H3 is in a range of 15 mm to 18 mm. In some embodiments, the third height H3 is in a range of 15 mm to 17 mm. In some embodiments, the third height H3 is in a range of 15 mm to 16 mm.

In some embodiments, the third height H3 is in a range of 16 mm to 25 mm. In some embodiments, the third height H3 is in a range of 16 mm to 24 mm. In some embodiments, the third height H3 is in a range of 16 mm to 23 mm. In some embodiments, the third height H3 is in a range of 16 mm to 22 mm. In some embodiments, the third height H3 is in a range of 16 mm to 21 mm. In some embodiments, the third height H3 is in a range of 16 mm to 20 mm. In some embodiments, the third height H3 is in a range of 16 mm to 19 mm. In some embodiments, the third height H3 is in a range of 16 mm to 18 mm. In some embodiments, the third height H3 is in a range of 16 mm to 17 mm.

In some embodiments, the third height H3 is in a range of 17 mm to 25 mm. In some embodiments, the third height H3 is in a range of 17 mm to 24 mm. In some embodiments, the third height H3 is in a range of 17 mm to 23 mm. In some embodiments, the third height H3 is in a range of 17 mm to 22 mm. In some embodiments, the third height H3 is in a range of 17 mm to 21 mm. In some embodiments, the third height H3 is in a range of 17 mm to 20 mm. In some embodiments, the third height H3 is in a range of 17 mm to 19 mm. In some embodiments, the third height H3 is in a range of 17 mm to 18 mm.

In some embodiments, the third height H3 is in a range of 18 mm to 25 mm. In some embodiments, the third height H3 is in a range of 18 mm to 24 mm. In some embodiments, the third height H3 is in a range of 18 mm to 23 mm. In some embodiments, the third height H3 is in a range of 18 mm to 22 mm. In some embodiments, the third height H3 is in a range of 18 mm to 21 mm. In some embodiments, the third height H3 is in a range of 18 mm to 20 mm. In some embodiments, the third height H3 is in a range of 18 mm to 19 mm.

In some embodiments, the third height H3 is in a range of 19 mm to 25 mm. In some embodiments, the third height H3 is in a range of 19 mm to 24 mm. In some embodiments, the third height H3 is in a range of 19 mm to 23 mm. In some embodiments, the third height H3 is in a range of 19 mm to 22 mm. In some embodiments, the third height H3 is in a range of 19 mm to 21 mm. In some embodiments, the third height H3 is in a range of 19 mm to 20 mm.

In some embodiments, the third height H3 is in a range of 20 mm to 25 mm. In some embodiments, the third height H3 is in a range of 20 mm to 24 mm. In some embodiments, the third height H3 is in a range of 20 mm to 23 mm. In some embodiments, the third height H3 is in a range of 20 mm to 22 mm. In some embodiments, the third height H3 is in a range of 20 mm to 21 mm.

In some embodiments, the third height H3 is in a range of 21 mm to 25 mm. In some embodiments, the third height H3 is in a range of 21 mm to 24 mm. In some embodiments, the third height H3 is in a range of 21 mm to 23 mm. In some embodiments, the third height H3 is in a range of 21 mm to 22 mm.

In some embodiments, the third height H3 is in a range of 22 mm to 25 mm. In some embodiments, the third height H3 is in a range of 22 mm to 24 mm. In some embodiments, the third height H3 is in a range of 22 mm to 23 mm. In some embodiments, the third height H3 is in a range of 23 mm to 25 mm. In some embodiments, the third height H3 is in a range of 23 mm to 24 mm. In some embodiments, the third height H3 is in a range of 24 mm to 25 mm.

In some embodiments, the third height H3 is 15 mm. In some embodiments, the third height H3 is 16 mm. In some embodiments, the third height H3 is 17 mm. In some embodiments, the third height H3 is 18 mm. In some embodiments, the third height H3 is 19 mm. In some embodiments, the third height H3 is 20 mm. In some embodiments, the third height H3 is 21 mm. In some embodiments, the third height H3 is 22 mm. In some embodiments, the third height H3 is 23 mm. In some embodiments, the third height H3 is 24 mm. In some embodiments, the third height H3 is 25 mm.

In some embodiments, the fourth height H4 is in a range of 5 mm to 15 mm. In some embodiments, the fourth height H4 is in a range of 5 mm to 14 mm. In some embodiments, the fourth height H4 is in a range of 5 mm to 13 mm. In some embodiments, the fourth height H4 is in a range of 5 mm to 12 mm. In some embodiments, the fourth height H4 is in a range of 5 mm to 11 mm. In some embodiments, the fourth height H4 is in a range of 5 mm to 10 mm. In some embodiments, the fourth height H4 is in a range of 5 mm to 9 mm. In some embodiments, the fourth height H4 is in a range of 5 mm to 8 mm. In some embodiments, the fourth height H4 is in a range of 5 mm to 7 mm. In some embodiments, the fourth height H4 is in a range of 5 mm to 6 mm.

In some embodiments, the fourth height H4 is in a range of 6 mm to 15 mm. In some embodiments, the fourth height H4 is in a range of 6 mm to 14 mm. In some embodiments, the fourth height H4 is in a range of 6 mm to 13 mm. In some embodiments, the fourth height H4 is in a range of 6 mm to 12 mm. In some embodiments, the fourth height H4 is in a range of 6 mm to 11 mm. In some embodiments, the fourth height H4 is in a range of 6 mm to 10 mm. In some embodiments, the fourth height H4 is in a range of 6 mm to 9 mm. In some embodiments, the fourth height H4 is in a range of 6 mm to 8 mm. In some embodiments, the fourth height H4 is in a range of 6 mm to 7 mm.

In some embodiments, the fourth height H4 is in a range of 7 mm to 15 mm. In some embodiments, the fourth height H4 is in a range of 7 mm to 14 mm. In some embodiments, the fourth height H4 is in a range of 7 mm to 13 mm. In some embodiments, the fourth height H4 is in a range of 7 mm to 12 mm. In some embodiments, the fourth height H4 is in a range of 7 mm to 11 mm. In some embodiments, the fourth height H4 is in a range of 7 mm to 10 mm. In some embodiments, the fourth height H4 is in a range of 7 mm to 9 mm. In some embodiments, the fourth height H4 is in a range of 7 mm to 8 mm.

In some embodiments, the fourth height H4 is in a range of 8 mm to 15 mm. In some embodiments, the fourth height H4 is in a range of 8 mm to 14 mm. In some embodiments, the fourth height H4 is in a range of 8 mm to 13 mm. In some embodiments, the fourth height H4 is in a range of 8 mm to 12 mm. In some embodiments, the fourth height H4 is in a range of 8 mm to 11 mm. In some embodiments, the fourth height H4 is in a range of 8 mm to 10 mm. In some embodiments, the fourth height H4 is in a range of 8 mm to 9 mm.

In some embodiments, the fourth height H4 is in a range of 9 mm to 15 mm. In some embodiments, the fourth height H4 is in a range of 9 mm to 14 mm. In some embodiments, the fourth height H4 is in a range of 9 mm to 13 mm. In some embodiments, the fourth height H4 is in a range of 9 mm to 12 mm. In some embodiments, the fourth height H4 is in a range of 9 mm to 11 mm. In some embodiments, the fourth height H4 is in a range of 9 mm to 10 mm.

In some embodiments, the fourth height H4 is in a range of 10 mm to 15 mm. In some embodiments, the fourth height H4 is in a range of 10 mm to 14 mm. In some embodiments, the fourth height H4 is in a range of 10 mm to 13 mm. In some embodiments, the fourth height H4 is in a range of 10 mm to 12 mm. In some embodiments, the fourth height H4 is in a range of 10 mm to 11 mm.

In some embodiments, the fourth height H4 is in a range of 11 mm to 15 mm. In some embodiments, the fourth height H4 is in a range of 11 mm to 14 mm. In some embodiments, the fourth height H4 is in a range of 11 mm to 13 mm. In some embodiments, the fourth height H4 is in a range of 11 mm to 12 mm.

In some embodiments, the fourth height H4 is in a range of 12 mm to 15 mm. In some embodiments, the fourth height H4 is in a range of 12 mm to 14 mm. In some embodiments, the fourth height H4 is in a range of 12 mm to 13 mm. In some embodiments, the fourth height H4 is in a range of 13 mm to 15 mm. In some embodiments, the fourth height H4 is in a range of 13 mm to 14 mm. In some embodiments, the fourth height H4 is in a range of 14 mm to 15 mm.

In some embodiments, the fourth height H4 is 5 mm. In some embodiments, the fourth height H4 is 6 mm. In some embodiments, the fourth height H4 is 7 mm. In some embodiments, the fourth height H4 is 8 mm. In some embodiments, the fourth height H4 is 9 mm. In some embodiments, the fourth height H4 is 10 mm. In some embodiments, the fourth height H4 is 11 mm. In some embodiments, the fourth height H4 is 12 mm. In some embodiments, the fourth height H4 is 13 mm. In some embodiments, the fourth height H4 is 14 mm. In some embodiments, the fourth height H4 is 15 mm.

In some embodiments, the solar module 16 and the ledge 86 form a second space 88 therebetween. In some embodiments, the second space 88 of one 10a of the photovoltaic modules 10 is sized and shaped to receive the first edge 27 of the solar module 16 of another 10b photovoltaic module 10 and interlock the photovoltaic modules 10a, 10b. In some embodiments, the solar module 16 of the photovoltaic module 10a overlays and holds-down the first edge 27 of the solar module 16 of the photovoltaic module 10b. In some embodiments, the interlocked photovoltaic modules 10a, 10b promote watershedding.

In some embodiments, the photovoltaic modules 10a, 10b are installed on a roof deck by a plurality of fasteners 90. In some embodiments, the mat 12 is configured to receive the plurality of fasteners 90. In some embodiments, the plurality of fasteners 90 includes a plurality of nails. In some embodiments, the mat 12 includes a head lap 92. In some embodiments, the head lap 92 is configured to receive the plurality of nails. In some embodiments, the second edge 60 of the spacer 14 is attached to the roof deck by an adhesive 94. In certain embodiments, the adhesive 94 includes polyvinyl butyrate, acrylic, silicone, polycarbonate, or pressure sensitive adhesives.

In some embodiments, the spacer 14 of one of the photovoltaic modules 10 overlays the mat 12 of another of the photovoltaic modules 10. In some embodiments, the spacer 14 of one of the photovoltaic modules 10 overlays the head lap 92 of the mat 12 of another of the photovoltaic modules 10.

Figure 9:
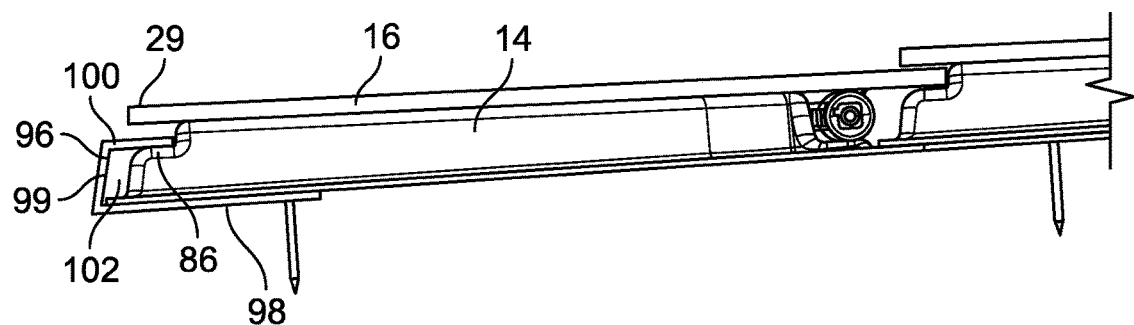
Figure 10:
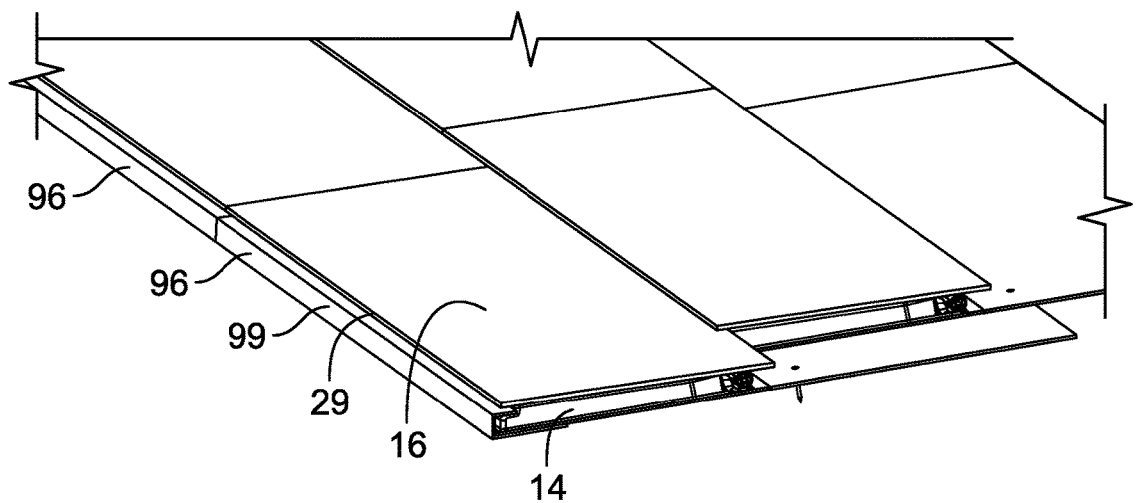
FIG. 10 is a top perspective view of a plurality of photovoltaic modules shown in FIG. 9.
Figure 11:
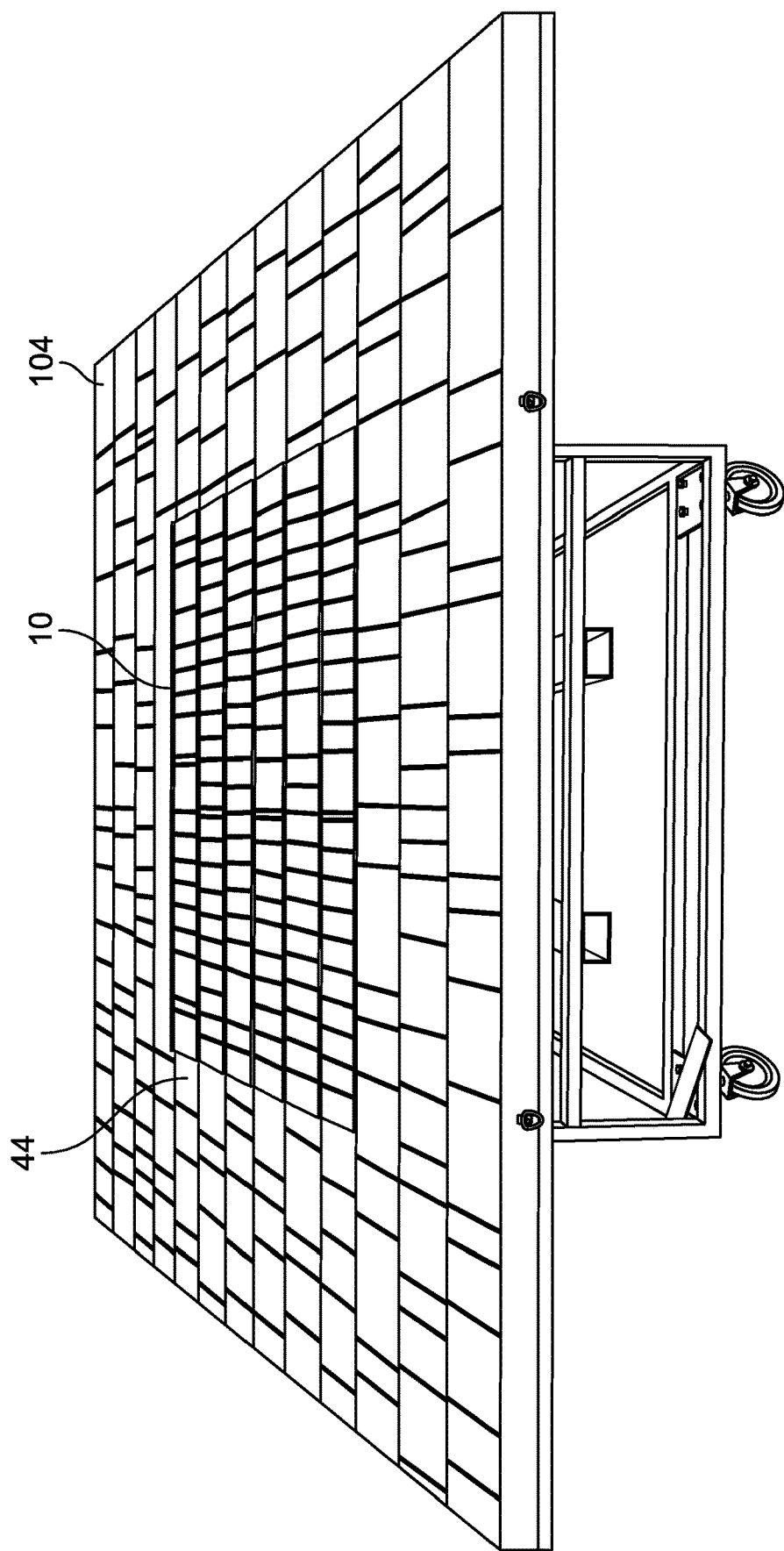
FIG. 11 is a photo of a plurality of photovoltaic modules installed on a roof deck.

Referring to FIGS. 9 and 10, in an embodiment, a starter bar 96 is engaged with the ledge 86 of the spacer 14 of one of the photovoltaic modules 10. In some embodiments, the starter bar 96 includes a base 98, a front wall 99 extending from the base 98, an upper rail 100 extending from the front wall, and a channel 102 formed by the base 98, the front wall 99 and the upper rail 100. In some embodiments, the front wall 99 extends substantially perpendicular to the base 98. In some embodiments, the upper rail 100 extends substantially parallel to the base 98. In some embodiments, the starter bar 96 includes a C-shaped cross-section. In some embodiments, the channel 102 is sized and shaped to receive the second edge 60 of the spacer 14, such that the second edge 60 is positioned therein intermediate the base 98 and the upper rail 100. In some embodiments, the upper rail 100 is configured to be positioned intermediate the ledge 86 of the spacer 14 and the second edge 29 of the solar module 16. In some embodiments, the starter bar 96 is installed on the roof deck. In some embodiments, the base 98 of the starter bar 96 is attached to the roof deck. In some embodiments, the base 98 is attached to the roof deck by a plurality of the nails 90. In some embodiments, FIG. 11 shows a system of a plurality of photovoltaic modules 10 and a plurality of the roofing shingles 44 installed on a roof deck 104.

In some embodiments, the spacer 14 is composed of plastic. In some embodiments, the spacer 14 is composed of a polymer. In some embodiments, the polymer is a thermoformed polymer. In some embodiments, the polymer is an injection molded polymer. In some embodiments, the spacer 14 is ultrasonically welded to the mat 12. In some embodiments, the spacer 14 is heat welded to the mat 12. In some embodiments, the spacer 14 is thermally bonded to the mat 12. In some embodiments, the spacer 14 is attached to the mat 12 by an adhesive. In some embodiments, the spacer 14 and the mat 12 are integral with one another. In some embodiments, the solar module 16 is ultrasonically welded to the spacer 14. In some embodiments, the solar module 16 is removably attached to the spacer 14. In some embodiments, the solar module 16 is heat welded to the spacer 14. In some embodiments, the solar module 16 is thermally bonded to the spacer 14. In some embodiments, the solar module 16 is attached to the spacer 14 by an adhesive. In some embodiments, the spacer 14 is composed of metal. In some embodiments, the spacer 14 is composed of aluminum.

Referring to FIGS. 12A through 12C, in another embodiment, a photovoltaic module 210 includes a spacer 214 and a solar module 216 attached to the spacer 214. In some embodiments, the spacer 214 includes a plurality of support members 218. In some embodiments, the spacer 114 includes at least one tab 221 extending outwardly from a first edge 258 thereof. In some embodiments, the at least one tab 221 extends from a corresponding one of the plurality of support members 218. In some embodiments, the at least one tab 221 includes a plurality of the tabs 221. In some embodiments, the at least one tab 221 is configured to receive a fastener. In some embodiments, the fastener includes a nail. In some embodiments, the spacer 214 is composed of metal. In some embodiments, the spacer 214 is composed of sheet metal.

Figure 13A:
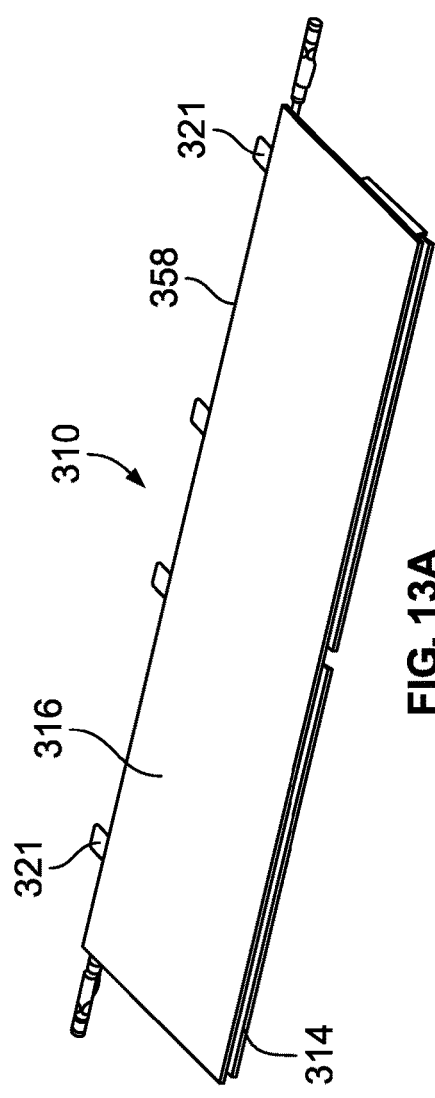
FIGS. 13A through 13C are top perspective, bottom perspective and side elevational views of an embodiment of a photovoltaic module.
Figure 13C:
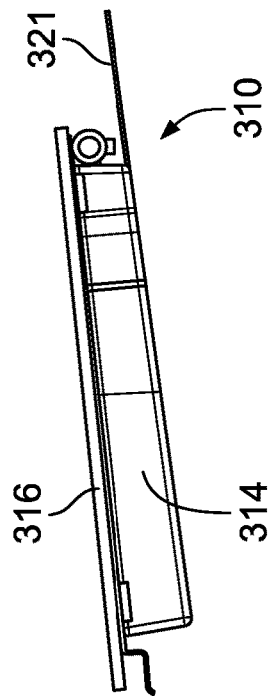
Figure 13B:
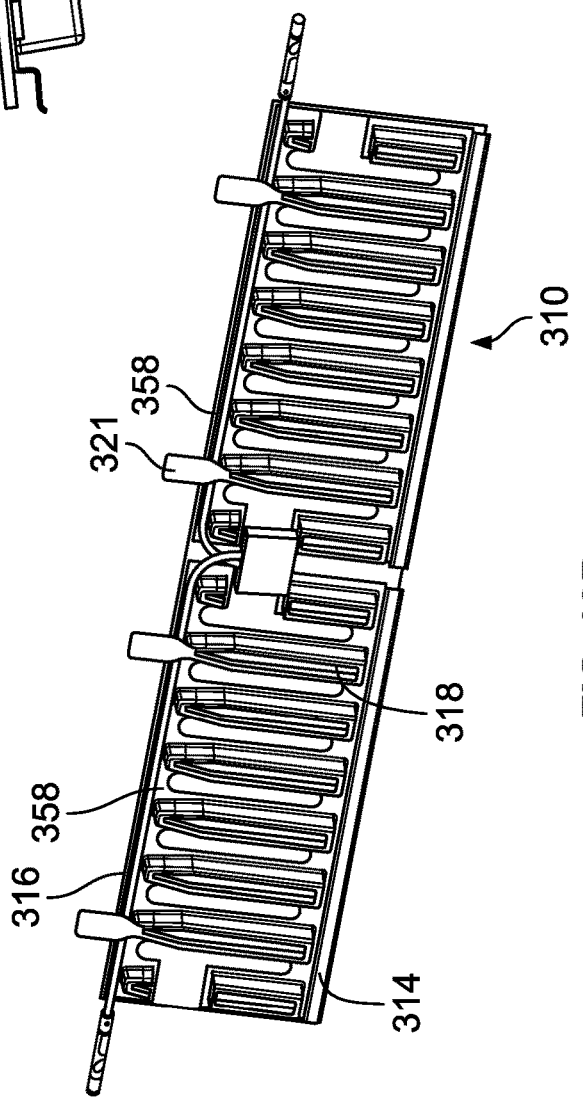
Figure 14:
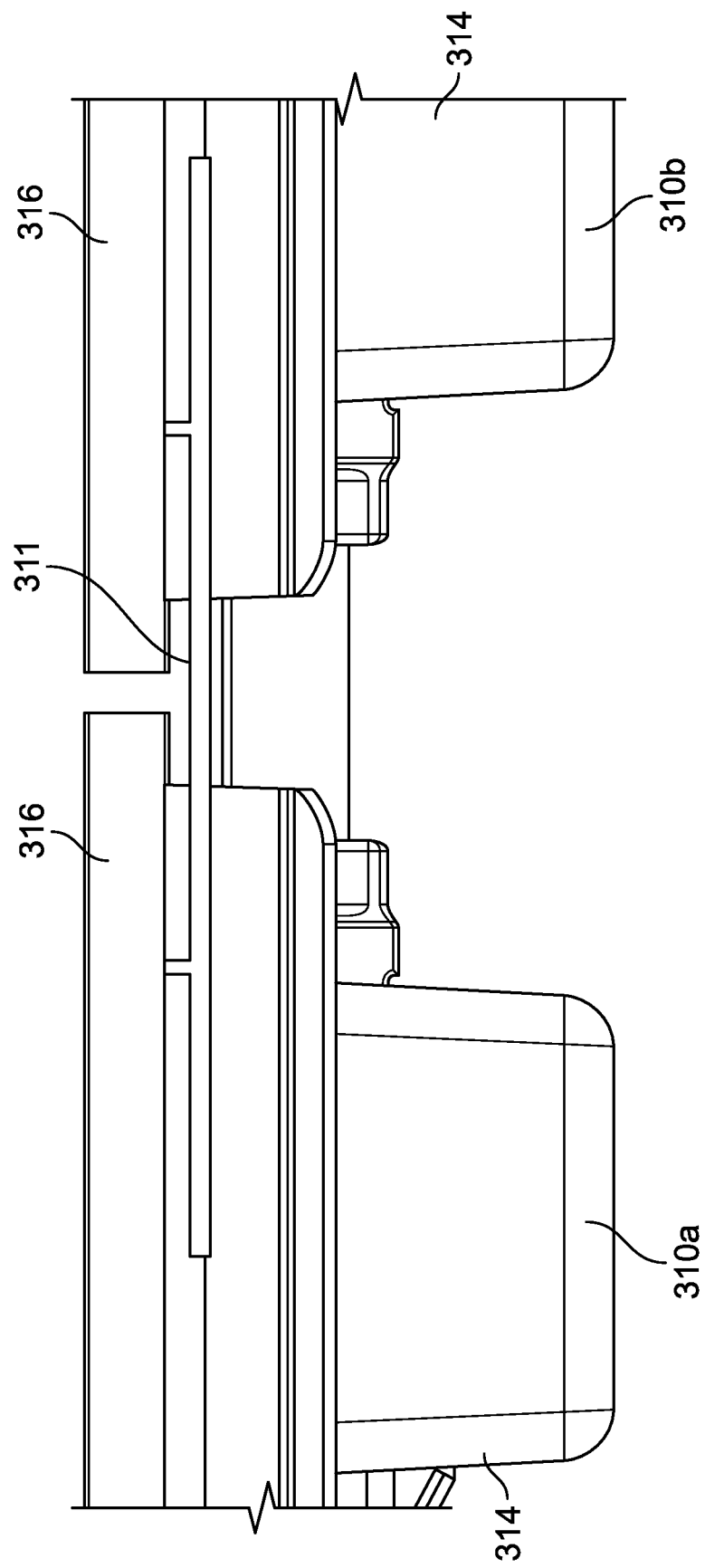
FIG. 14 is a side view of an embodiment of a plurality of photovoltaic modules.
Figure 17:
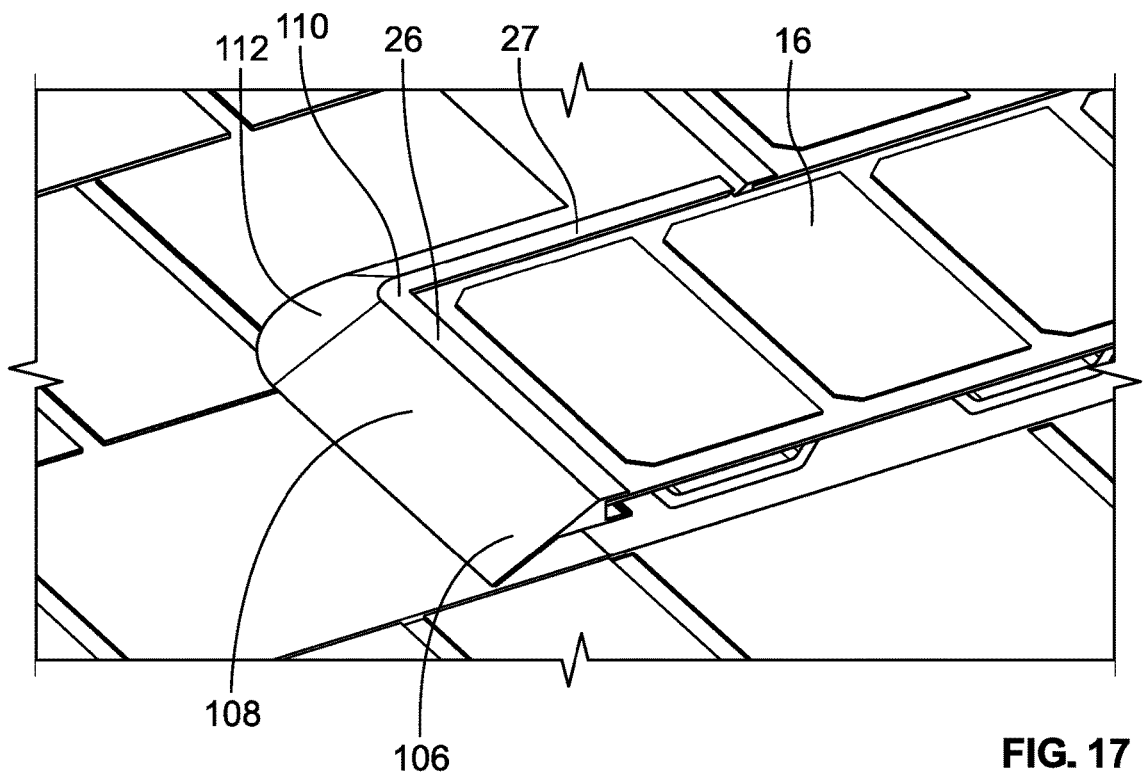
FIGS. 17 and 18 are photos of embodiments of photovoltaic modules with aesthetic trim installed on a roof deck.
Figure 18:
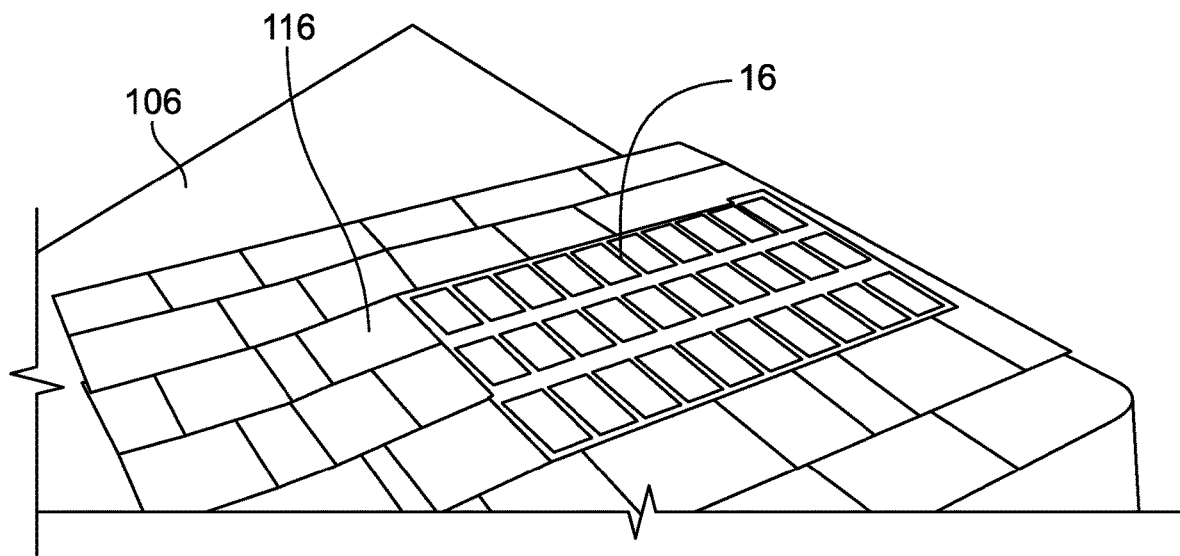
Figure 19A:
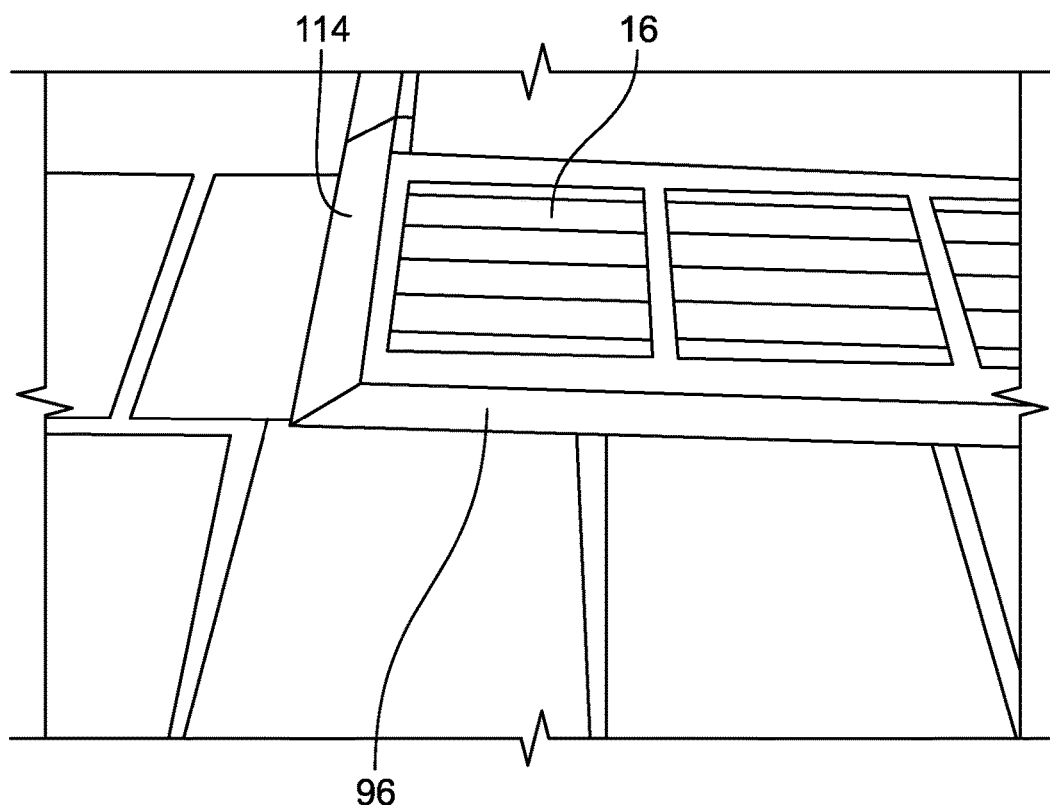
FIGS. 19A and 19B are photos of embodiments of photovoltaic modules with side flashing installed on a roof deck.
Figure 19B:
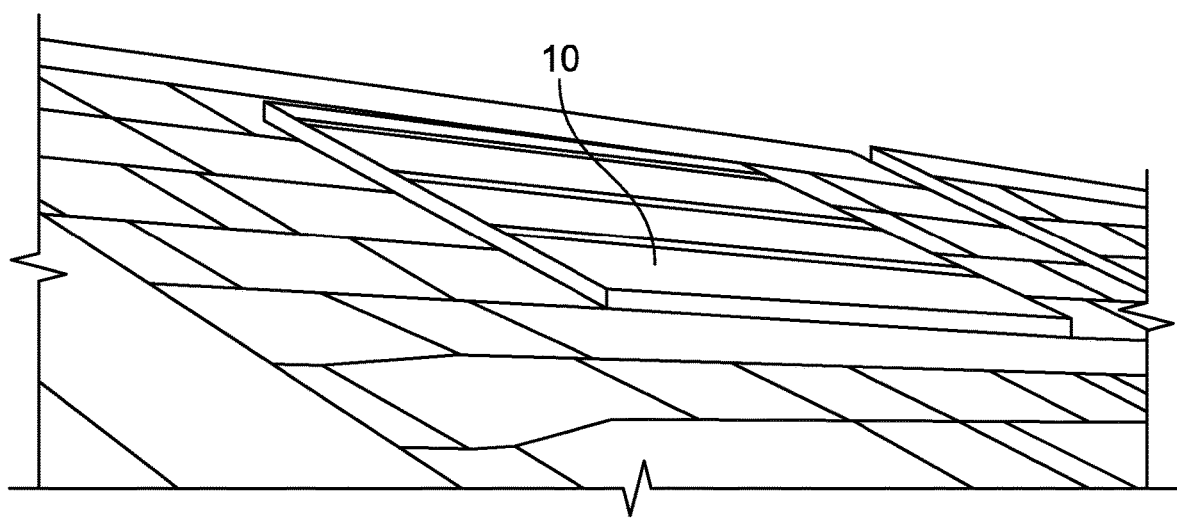

Referring to FIGS. 13A through 13C, in another embodiment, a photovoltaic module 310 includes a spacer 314 and a solar module 316 attached to the spacer 314. In some embodiments, the spacer 314 includes a plurality of support members 318. In some embodiments, the spacer 314 includes at least one tab 321 extending outwardly from a first edge 358 thereof. In some embodiments, the at least one tab 321 extends from a corresponding one of the plurality of support members 318. In some embodiments, the at least one tab 321 includes a plurality of the tabs 321. In some embodiments, the at least one tab 321 is configured to receive a fastener. In some embodiments, the fastener includes a nail. In some embodiments, the spacer 314 is composed of plastic. In some embodiments, the spacer 314 is injection molded. Referring to FIG. 14, a side lap 311 extends between two of adjacent photovoltaic modules 310a, 310b. In some embodiments, the side lap 311 is located intermediate the spacer 314 and the solar module 316 of each of the photovoltaic modules 310a, 310b.

Referring to FIGS. 15A through 16C, in another embodiment, a photovoltaic module 410 includes a spacer 414 and at least two solar modules 416a, 416b attached to the spacer 414. In some embodiments, the solar modules 416a, 416b are aligned in rows. In some embodiments, the spacer 414 includes a plurality of support members 418. In some embodiments, the spacer 414 includes at least one tab 421 extending outwardly from a first edge 458 thereof. In some embodiments, the at least one tab 421 includes a plurality of the tabs 421. In some embodiments, the at least one tab 421 is configured to receive a fastener. In some embodiments, the fastener includes a nail. In some embodiments, the spacer 414 includes sidewalls 415a, 415b that enclose the photovoltaic module 410 when it is installed on roof deck.

Referring to FIGS. 17 through 19B, in an embodiment, at least one trim element 106 is attached to at least one of the first and second ends 26, 28 of the solar module 16. In some embodiments, the trim element 106 is clipped to the at least one of the first and second ends 26, 28. In some embodiments, the trim element 106 includes an upper surface 108. In some embodiments, the upper surface 108 is oblique relative to the first surface 22 of the solar module 16. In some embodiments, the solar module 16 includes a corner 110 formed by the first end 26 and the first edge 27 and the trim element 106 is attached to the corner 110. In other embodiments, the corner 110 may be formed by the first edge 27 and the second edge 29, the second end 28 and the first edge 27, or the second end 28 and the second edge 29, one or more of which is configured to receive a corresponding trim element 106. In some embodiments, the trim element 106 includes a curvilinear side surface 112. In some embodiments, the trim element 106 includes flashing 114. In some embodiments, at least one roofing shingle 116 overlays the upper surface 108 of the trim element 106.

Figure 22:
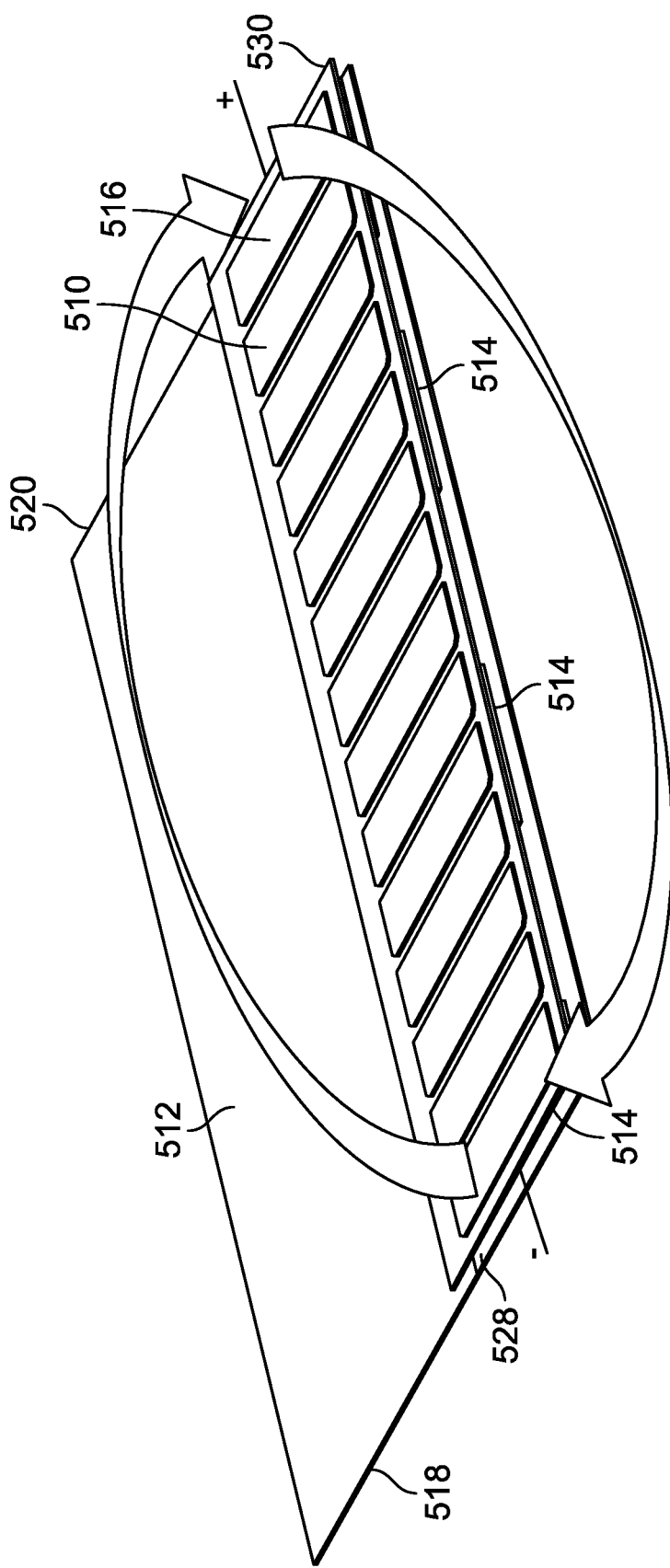

Referring to FIGS. 20 through 22, in an embodiment, a roofing system 500 includes a photovoltaic module 510 configured to be installed on a roof deck 505. In some embodiments, the photovoltaic module 510 includes at least one mat 512 configured to be installed to the roof deck 505, at least one spacer 514 installed on the mat 512, and at least one solar module 516 mounted to a corresponding one of the at least one spacer 514. In some embodiments, the at least one spacer 514 includes a plurality of spacers 514. In some embodiments, the at least one solar module 516 includes a plurality of solar modules 516 mounted to a corresponding one of the plurality of spacers 514.

Figure 23:
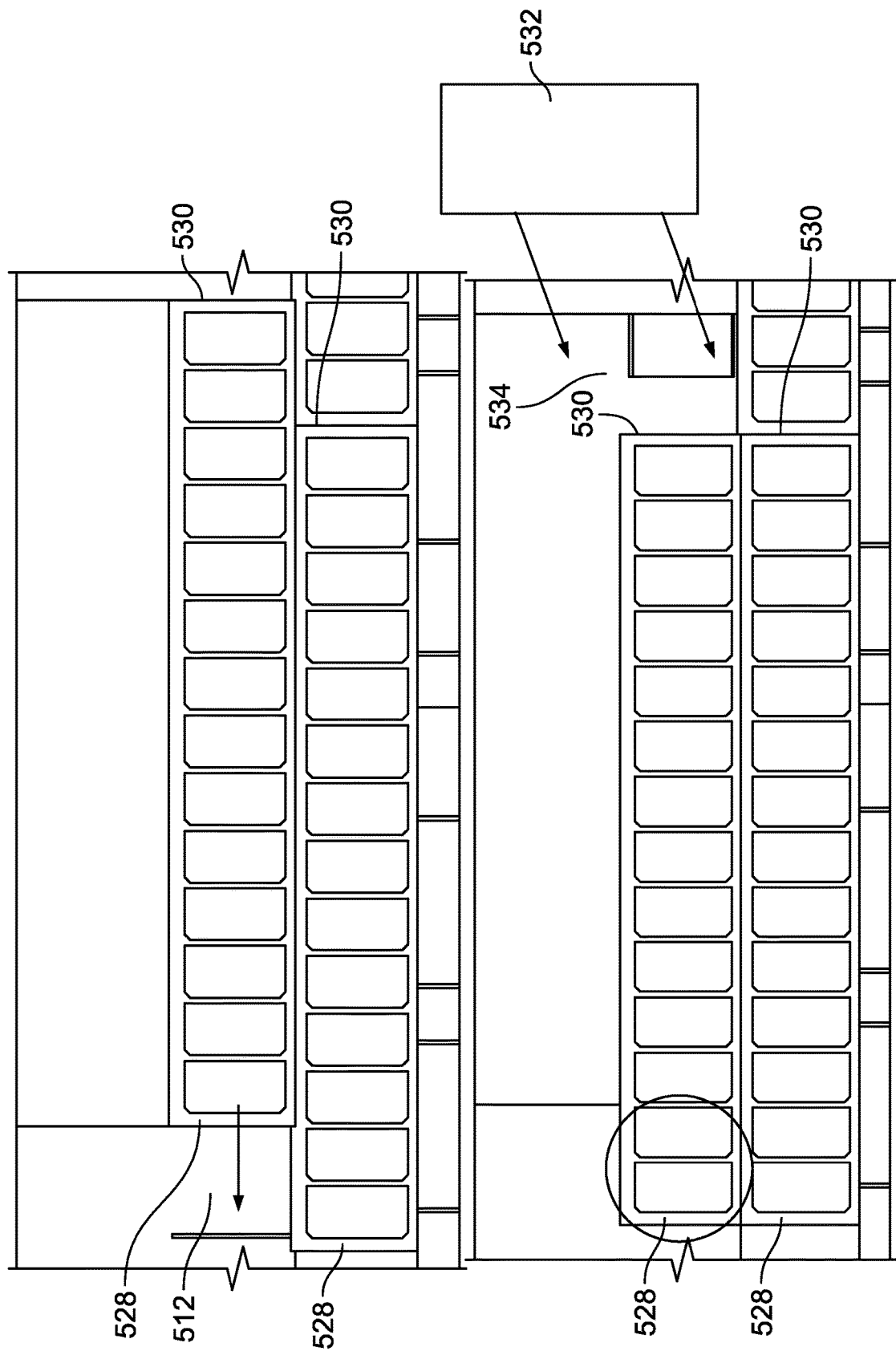
FIGS. 23 and 24 are a top plan view and a photo of an embodiment of the system shown in FIGS. 20 through 22.
Figure 24:
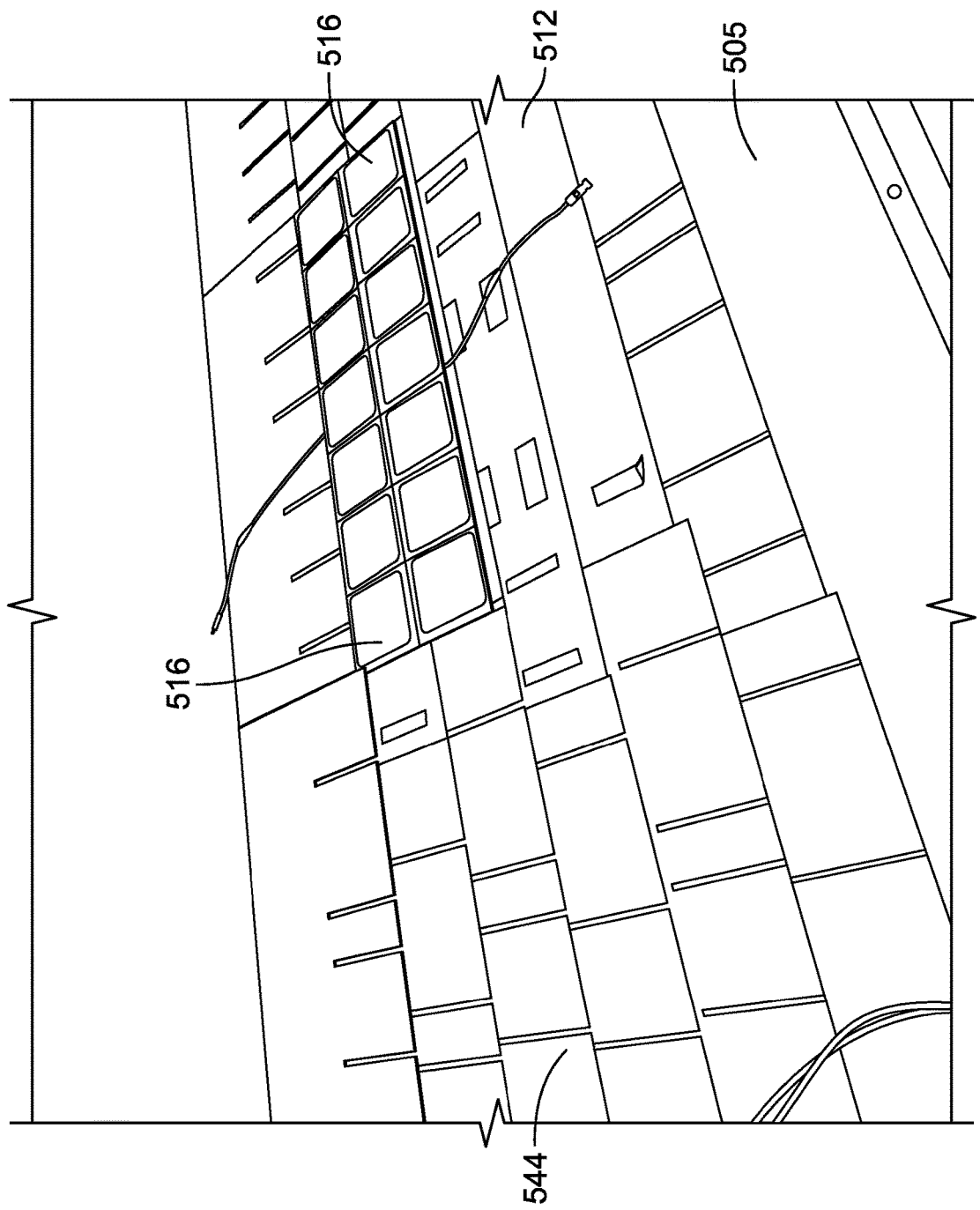

In some embodiments, the at least one mat 512 includes a first end 518 and a second end 520 opposite the first end 518, a first edge 522 extending from the first end 518 to the second end 520, and a second edge 524 opposite the first edge 522 and extending from the first end 518 to the second end 520. In some embodiments, the at least one mat 512 includes a head lap 526. In some embodiments, the at least one solar module 516 includes a first end 528 and a second end 530 opposite the first end 528. In some embodiments, the first end 528 of the at least one solar module 516 is substantially aligned with the first end 518 of the at least one mat 512, and the second end 530 of the at least one solar module 516 is substantially aligned with the at least one second end 520 of the mat 512. In some embodiments, the second end 530 of the at least one solar module 516 is substantially aligned with the first end 518 of the at least one mat 512, and the first end 528 of the at least one solar module 516 is substantially aligned with the at least one second end 520 of the mat 512 (see FIG. 22). Referring to FIGS. 23 and 24, in an embodiment, the first end 528 of the at least one solar module 516 is offset from the first end 518 of the at least one mat 512, and the second end 530 of the at least one solar module 516 is offset from the second end 520 of the least one mat 512. In some embodiments, at least one shingle section 532 overlays an exposed area 534 of the mat 512.

In some embodiments, the at least one mat 512 includes a plurality of mats 512. In some embodiments, the roofing system 500 includes a plurality of roofing shingles 544 installed adjacent to the at least one mat 512.

Referring to FIGS. 25A and 25B, in an embodiment, the at least one mat 512 includes at least one first hook member 540. In some embodiments, the photovoltaic module 510 includes at least one second hook member 542 engaged with a corresponding one of the at least one first hook member 540. In some embodiments, the at least one first hook member 540 includes at least one pair of first hook members 540 and the at least one second hook member 542 includes at least one pair of second hook members 542. In some embodiments, each of the at least one pair of first hook members 540 engages a corresponding one of the at least one pair of second hook members 542. In some embodiments, each of the at least one pair of first hook members 540 is spaced apart from one another. In some embodiments, the at least one pair of second hook members 542 is spaced apart from one another. In some embodiments, the at least one pair of first hook members 540 includes a plurality of pairs of first hook members 540. In some embodiments, each of the plurality of pairs of first hook members 540 is spaced apart from one another. In some embodiments, the plurality of pairs of first hook members 540 are aligned in rows.

Referring to FIGS. 26A and 26B, in an embodiment, a roofing system 600 includes a roofing layer 612 configured to be installed directly on a roof deck 605. In some embodiments, the roofing layer 612 includes a roofing membrane. In some embodiments, the roofing membrane is configured to be rolled. In some embodiments, the roofing membrane is composed of a polymer. In some embodiments, the roofing membrane includes thermoplastic polyolefin (TPO). In other embodiments, the roofing membrane is composed of polyethylene terephthalate (PET), polyethylene naphthalate (PEN), polyetheretherketone (PEEK), polyaryletherketone (PAEK), polyarylate (PAR), polyetherimide (PEI), polyarylsulfone (PAS), polyethersulfone (PES), polyamideimide (PAI), or polyimide; polyvinyl chloride (PVC); ethylene propylene diene monomer (EPDM) rubber; silicone rubber; fluoropolymers-ethylene tetrafluoroethylene (ETFE), polyvinylidine fluoride (PVDF), tetrafluoroethylene-hexafluoropropylene copolymers (FEP), and tetrafluoroethylene-hexafluoropropylene-vinylidene fluoride copolymers (THV), or blends thereof. In some embodiments, the roofing layer 612 includes a first surface 614.

In some embodiments, a plurality of hooks 650 is installed on the first surface 614 of the roofing layer 612. In some embodiments, the system 600 includes a plurality of solar modules 616 configured to be attached to the plurality of hooks 650. In some embodiments, each of the plurality of hooks 650 includes a double wing hook. In some embodiments, the plurality of hooks 650 is arranged in a defined pattern. In some embodiments, the pattern includes a plurality of rows and a plurality of columns. In some embodiments, the plurality of hooks 650 is arranged in a long-staggered pattern, as shown in FIGS. 26A and 26B. In some embodiments, the plurality of hooks 650 in each row of the long-staggered pattern are arranged and located in alternate columns. In some embodiments, the plurality of hooks 650 is arranged in a short-staggered pattern. In some embodiments, the plurality of hooks 650 in each column of the short-staggered pattern are arranged and located in alternate rows. In some embodiments, the plurality of hooks 650 is arranged in a square or rectangular pattern. In some embodiments, the plurality of hooks 650 in each row of the long-staggered pattern are arranged and located in each column, and vice-versa. In some embodiments, the plurality of hooks 650 is arranged in a random pattern.

Referring to FIGS. 27 through 30, in an embodiment, a roofing layer 712 includes at least one roofing shingle 720. In some embodiments, the at least one roofing shingle 720 is installed on the roof deck 705 by a plurality of fasteners. In some embodiments, the at least one roofing shingle 720 includes a plurality of roofing shingles 720. In some embodiments, the at least one shingle 720 includes a head lap 722. In some embodiments, the head lap 722 is configured to receive the plurality of fasteners. In some embodiments, the plurality of fasteners includes a plurality of nails. In some embodiments, the at least one roofing shingle 720 is installed on the roof deck 705 by an adhesive. In some embodiments, one of the plurality of roofing shingles 720 overlays the head lap 722 of another of the plurality of roofing shingles 720.

In some embodiments, a plurality of hooks 750 includes a mounting portion 752, a pair of legs 754a, 754b extending from the mounting portion 752, and a hook portion 756 extending from the mounting portion 752 and offset from the pair of legs 754a, 754b to form a slot 758 therebetween.

In some embodiments, the pair of legs 754a, 754b are spaced apart and substantially parallel to one another. In some embodiments, the hook portion 756 includes a first portion 755a extending in a first direction and second portion 755b extending in a second direction opposite the first direction. In some embodiments, a slot 757 is formed between the first and second portions 755a, 755b. In some embodiments, each of the legs 754a, 754b includes an extended portion 759 and a foot 760 having a raised portion 761 offset from the extended portion 759. In some embodiments, a first edge 727 of one of the plurality of solar modules 716 engages the slot 758 of one of the plurality of hooks 750, and a second edge 729 of the one of the plurality of solar modules 716 engages the hook portion 756 of at least another one of the plurality of hooks 750. In some embodiments, the hook portion 756 is resiliently biased. In some embodiments, the mounting portion 752 is attached to the head lap 722 of the corresponding one of the plurality of roofing shingles 720. In some embodiments, the mounting portion 752 is configured to receive at least one fastener. In some embodiments, the at least one fastener includes at least one nail.

It should be understood that the embodiments described herein are merely exemplary and that a person skilled in the art may make many variations and modifications without departing from the spirit and scope of the invention. All such variations and modifications are intended to be included within the scope of the invention.

What is claimed is:
1. A system, comprising:
a roof deck;
a plurality of photovoltaic modules installed on the roof deck,
  wherein the plurality of photovoltaic modules is arranged in an array,
  wherein the array includes
    an upper side extending along the roof deck,
    a lower side extending along the roof deck,
    at least a first side extending between the upper side and the lower side, and
    an upper surface,
    wherein the upper surface extends in a first plane;
at least one trim element installed on the roof deck,
  wherein the at least one trim element includes a first trim element, wherein the first trim element is proximate to the first side of the array; and a plurality of roofing shingles installed on the roof deck,
wherein each of the plurality of roofing shingles includes an upper surface,
wherein the plurality of roofing shingles includes a first roofing shingle,
wherein the first roofing shingle includes a first end,
wherein the first roofing shingle overlays the first trim element,
wherein at least a portion of the first roofing shingle extends in a second plane,
wherein the second plane is different from the first plane, and
wherein the upper surface of the array is above the upper surface of the first roofing shingle, and
wherein the first end of the first roofing shingle is adjacent to the upper surface of the array at the first plane.

2. The system of claim 1, wherein the first trim element includes an upper surface, and wherein the at least a portion of the first roofing shingle overlays the upper surface of the first trim element.

3. The system of claim 1, wherein each of the plurality of photovoltaic modules extends substantially in the first plane.

4. The system of claim 1, wherein the second plane is oblique to the first plane.

5. The system of claim 1, wherein the first roofing shingle is an asphalt shingle.

6. The system of claim 1, wherein the plurality of photovoltaic modules includes a first photovoltaic module, and wherein the first trim element is clipped to the first photovoltaic module.

7. The system of claim 1, wherein the array includes a second side extending between the upper side and the lower side, wherein the at least one trim element includes a second trim element, and wherein the second trim element is located proximate to the second side of the array.

8. The system of claim 7, wherein the plurality of roofing shingles includes a second roofing shingle, and wherein at least a portion of the second roofing shingle overlays the second trim element.

9. The system of claim 8, wherein the second trim element includes an upper surface, and wherein the at least a portion of the second roofing shingle overlays the upper surface of the second trim element.

10. The system of claim 8, wherein the second roofing shingle is an asphalt shingle.

11. The system of claim 7, wherein the plurality of photovoltaic modules includes a second photovoltaic module, wherein the second trim element is clipped to the second photovoltaic module.

12. A system, comprising:
a roof deck;
a plurality of photovoltaic modules installed on the roof deck,
wherein the plurality of photovoltaic modules is arranged in an array,
wherein the array includes
an upper side extending along the roof deck,
a lower side extending along the roof deck,
a first side extending between the upper side and the lower side,
a second side extending between the upper side and the lower side, and
an upper surface,
wherein the upper surface extends in a first plane;

a plurality of trim elements installed on the roof deck,
wherein the plurality of trim elements includes a first trim element and a second trim element,
wherein the first trim element is proximate to the first side of the array,
wherein the second trim element is proximate to the second side of the array; and a plurality of roofing shingles installed on the roof deck,
wherein each of the plurality of roofing shingles includes an upper surface and a first end,
wherein the plurality of roofing shingles includes a first roofing shingle and a second roofing shingle,
wherein the first roofing shingle overlays the first trim element,
wherein at least a portion of the first roofing shingle extends in a second plane, and
wherein the second plane is different from the first plane,
wherein the second roofing shingle overlays the second trim element,
wherein at least a portion of the second roofing shingle extends in a third plane,
and wherein the third plane is different from the first plane,
wherein the upper surface of the array is above the upper surface of the first roofing shingle and the upper surface of the second roofing shingle,
wherein the first end of the first roofing shingle is adjacent to the upper surface of the array at the first plane, and
wherein the first end of the second roofing shingle is adjacent to the upper surface of the array at the first plane.

13. The system of claim 12, wherein each of the first trim element and the second trim element includes an upper surface, wherein the at least a portion of the first roofing shingle overlays the upper surface of the first trim element, and wherein the at least a portion of the second roofing shingle overlays the upper surface of the second trim element.

14. The system of claim 12, wherein each of the plurality of photovoltaic modules extends substantially in the first plane.

15. The system of claim 12, wherein the second plane is oblique to the first plane.

16. The system of claim 12, wherein the third plane is oblique to the first plane.

17. The system of claim 12, wherein each of the first roofing shingle and the second roofing shingle is an asphalt shingle.

18. The system of claim 12, wherein the plurality of photovoltaic modules includes a first photovoltaic module and a second photovoltaic module, wherein the first trim element is clipped to the first photovoltaic module, and wherein the second trim element is clipped to the second photovoltaic module.

19. A system, comprising:
a roof deck;
a plurality of photovoltaic modules installed on the roof deck,
wherein the plurality of photovoltaic modules is arranged in an array,
wherein the array includes
an upper side extending along the roof deck,
a lower side extending along the roof deck,
at least a first side extending between the upper side and the lower side, and an upper surface,
wherein the upper surface extends in a first plane;
at least one trim element installed on the roof deck,
wherein the at least one trim element includes a first trim element,
wherein the first trim element is proximate to the first side of the array; and
a plurality of roofing shingles installed on the roof deck,
wherein each of the plurality of roofing shingles includes an upper surface,
wherein the plurality of roofing shingles includes a first roofing shingle,
wherein the first roofing shingle includes a first end,
wherein the first roofing shingle overlays the first trim element,
wherein at least a portion of the first roofing shingle extends in a second plane,
wherein the second plane is different from the first plane, and
wherein the upper surface of the array is above the upper surface of the first roofing shingle, and
wherein the first end of the first roofing shingle intersects the upper surface of the array at the first plane.

* * * * *